United States Patent
Cha et al.

(10) Patent No.: US 12,402,398 B2
(45) Date of Patent: Aug. 26, 2025

(54) CO-INTEGRATED RESONANT TUNNELING DIODE AND FIELD EFFECT TRANSISTOR

(71) Applicant: International Business Machines Corporation, Armonk, NY (US)

(72) Inventors: Eunjung Cha, Zurich (CH); Bogdan Cezar Zota, Rueschlikon (CH); Kirsten Emilie Moselund, Rüschlikon (CH); Katarzyna Hnida-Gut, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 489 days.

(21) Appl. No.: 17/714,267

(22) Filed: Apr. 6, 2022

(65) Prior Publication Data

US 2023/0326921 A1    Oct. 12, 2023

(51) Int. Cl.
*H10D 84/80*    (2025.01)
*H10D 8/01*    (2025.01)
(Continued)

(52) U.S. Cl.
CPC ........... *H10D 84/811* (2025.01); *H10D 8/053* (2025.01); *H10D 8/755* (2025.01); *H10D 30/015* (2025.01);
(Continued)

(58) Field of Classification Search
CPC ............. H01L 21/8252; H01L 27/0605; H01L 27/0727; H01L 29/66219; H01L 29/66462;
(Continued)

(56) References Cited

U.S. PATENT DOCUMENTS

| 5,294,564 | A | 3/1994 | Karapiperis et al. |
| 5,534,714 | A | 7/1996 | Beam, III et al. |

(Continued)

FOREIGN PATENT DOCUMENTS

| CN | 101064275 A | 10/2007 |
| CN | 101692438 A | 4/2010 |
| CN | 112236785 A | 1/2021 |

OTHER PUBLICATIONS

Terayama, T. et al. "Fluoride Resonant Tunneling Diodes Co-integrated with Si-MOSFETs." Jpn. J. Appl. Phys. vol. 41 (2002) pp. 2598-2601. (Year: 2002).*

(Continued)

*Primary Examiner* — Yara B Green
*Assistant Examiner* — Christopher M Roland
(74) *Attorney, Agent, or Firm* — Amin, Turocy & Watson, LLP

(57) ABSTRACT

One or more systems, devices and/or methods provided herein relate to a device that can facilitate generation of a pulse to affect a qubit and to a method that can facilitate fabrication of a semiconductor device. The semiconductor device can comprise an RTD and an FET co-integrated in a common layer extending along a substrate. A method for fabricating the semiconductor device can comprise applying, at a substrate layer, a template structure comprising an opening, a cavity and a seed structure comprising a seed material and a seed surface, and sequentially growing along the substrate a plurality of diode layers of an RTD and a plurality of transistor layers of an FET within the cavity of the template structure from the seed surface, wherein the RTD and FET are co-integrated along the substrate.

9 Claims, 10 Drawing Sheets

(51) Int. Cl.
*H10D 8/75* (2025.01)
*H10D 30/01* (2025.01)
*H10D 30/67* (2025.01)
*H10D 84/05* (2025.01)
*G06N 10/40* (2022.01)

(52) U.S. Cl.
CPC .......... *H10D 30/675* (2025.01); *H10D 84/05* (2025.01); *G06N 10/40* (2022.01)

(58) Field of Classification Search
CPC . H01L 29/78681; H01L 29/882; G06N 10/40; H10D 8/053; H10D 8/755; H10D 30/015; H10D 30/675; H10D 84/05; H10D 84/811
See application file for complete search history.

(56) References Cited

U.S. PATENT DOCUMENTS

| | | | |
|---|---|---|---|
| 6,294,412 | B1 | 9/2001 | Krivokapic |
| 6,490,193 | B1 * | 12/2002 | van der Wagt ......... G11C 11/38 365/175 |
| 9,117,753 | B2 | 8/2015 | Egard et al. |
| 9,608,567 | B2 | 3/2017 | Egard et al. |
| 9,923,049 | B2 | 3/2018 | Okamoto |
| 10,090,043 | B2 | 10/2018 | Frank |
| 2016/0094183 | A1 | 3/2016 | Ochi et al. |
| 2016/0218201 | A1 | 7/2016 | Okamoto |
| 2017/0117138 | A1 | 4/2017 | Xiao et al. |
| 2017/0365660 | A1 | 12/2017 | Borg et al. |
| 2018/0075901 | A1 | 3/2018 | Frank |
| 2019/0013066 | A1 | 1/2019 | Frank |
| 2019/0051656 | A1 | 2/2019 | Carlson et al. |
| 2021/0257969 | A1 | 8/2021 | Cheney |
| 2023/0327008 | A1 * | 10/2023 | Cha ................. H01L 29/66462 257/236 |

OTHER PUBLICATIONS

International Search Report and Written Opinion received for PCT Application Serial No. PCT/IB2023/052849 dated Jun. 26, 2023, 15 pages.
Egard et al., "Frequency Modulation in mm-Wave InGaAs MOSFET/RTD Wavelet Generators", IPRM, May 19-23, 2013, 2 pages.
Jazaeri et al.,"A Review on Quantum Computing: From Qubits to Front-end Electronics and Cryogenic MOSFET Physics", Quantam Physics, Aug. 7, 2019, 12 pages.
Broekaert et al.,"Functional InP/InGaAs Lateral Double Barrier Heterostructure Resonant Tunneling Diodes by Using Etch and Regrowth", Applied Physics Letters, vol. 69, Sep. 23, 1996, 4 pages.
International Search Report and Written Opinion received for PCT Application Serial No. PCT/IB2023/052564 dated Jun. 22, 2023, 16 pages.
Chen et al.,"Device Technology for Monolithic Integration of Inp-based Resonant Tunneling Diodes and Hemts", IEICE Transactions on Electronics, vol. E79, No. 11, Nov. 1996, 11 pages.
Nakasha et al., A W-band Wavelet Generator Using O.13-~ m InP HEMTs for Multigigabit Communications Based on Ultra-Wideband Impulse Radio, IEEE MTT-S International Microwave Symposium Digest, p. 109-112, 2008, 4 pgs.
Ohlsson et al., Picosecond dynamics in a millimetre-wave RTD-MOSFET wavelet generator, Electronics Letters, vol. 51 No. 21 p. 1671-1673, 2015, 2 pgs.
Haung et al., Resonant Tunnelling Diodes and High Electron Mobility Transistors Integratedon GaAs Substrates, CHIN.PHYS. LETT., vol. 23, No. 3, p. 697-700, 2006, 5 pgs.
Ekanayake et al., Qubit Control-Pulse Generator Circuits for Operation at Cryogenic Temperatures, 8th IEEE Conference on Nanotechnology, p. 472-475, 2008, 4 pgs.
Haitao et al., InP-Based RTD/HEMT Monolithic Integration, Trans. Tianjin Univ. 16, p. 267-269, 2010, 3 pgs.
Terayama et al., Fluoride Resonant Tunneling Diodes Co-integrated with Si-MOSFETs, Japanese Journal of Applied Physics, 2002, 3 pgs.
Egard et al., In0.53Ga0.47As RTD-MOSFET Millimeter-Wave Wavelet Generator, IEEE Electron Device Letters, vol. 33, No. 7, 2012, 5 pgs.
List of IBM Patents and Patent Applications Treated as Related.
Mell et al., "The NIST Definition of Cloud Computing," Recommendations of the National Institute of Standards and Technology, NIST Special Publication 800-145, Sep. 2011, 7 pages.
United States Non-Final Rejection dated Oct. 11, 2024, 20 pages, in U.S. Appl. No. 17/714,260.
Final Rejection Mailed on Apr. 10, 2025 for U.S. Appl. No. 17/714,260, 19 page(s).

* cited by examiner

CO-INTEGRATED RESONANT TUNNELING DIODE AND FIELD EFFECT TRANSISTOR

FIELD OF THE INVENTION

The present disclosure relates generally to semiconductors, and more specifically to a semiconductor device comprising a resonant tunneling diode and a field effect transistor.

BACKGROUND

In quantum computing systems, radar applications and/or other signal-based applications, semiconductor devices can be employed as or can be comprised by signal generators, such as pulse generators, waveform generators and/or the like.

SUMMARY

The following presents a summary to provide a basic understanding of one or more embodiments described herein. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate a process to manufacture a semiconductor device for generating a waveform, pulse or signal. In the quantum computing space, one or more embodiments described herein can facilitate a process to generate a pulse affecting a state and/or facilitating readout of a state of a qubit.

In accordance with one or more embodiments, a semiconductor device can comprise resonant tunneling diode (RTD) and a field effect transistor (FET) co-integrated in a common layer extending along a substrate.

In one or more embodiments, the semiconductor device can be comprised by a quantum computer having a cryostat, wherein the semiconductor device can be arranged inside the cryostat within a cryogenic environment.

In accordance with another embodiment, a method for fabricating a semiconductor device can comprise applying, at a substrate layer, a template structure comprising an opening, a cavity and a seed structure comprising a seed material and a seed surface, and sequentially growing along the substrate a plurality of diode layers of an RTD and a plurality of transistor layers of an FET within the cavity of the template structure from the seed surface, wherein the RTD and FET are co-integrated along the substrate.

An advantage of the aforementioned device, system and/or method can be an ability to closely co-integrate RTD and FET layers relative to one another, with the layers of each section (RTD section and FET section) being arranged next to one another along a direction along the substrate, thus providing a laterally-stacked arrangement.

DETAILED DESCRIPTION

Figure 1:
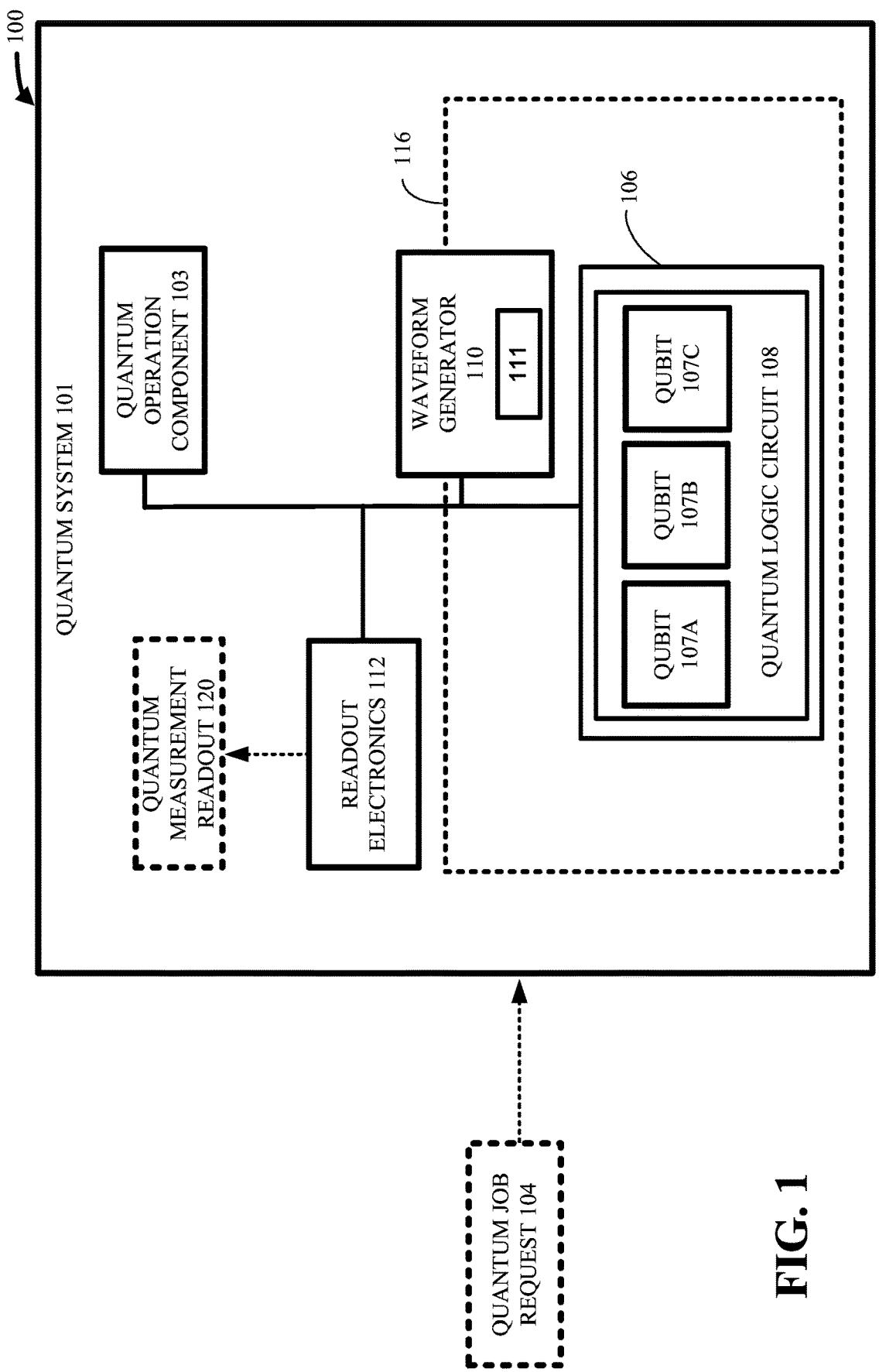
FIG. 1 illustrates a block diagram of an example, non-limiting system that can facilitate measurement readout from one or more qubits, in accordance with one or more embodiments described herein.

The following detailed description is merely illustrative and is not intended to limit embodiments and/or application or utilization of embodiments. Furthermore, there is no intention to be bound by any expressed or implied information presented in the preceding Summary section, or in the Detailed Description section. One or more embodiments are now described with reference to the drawings, wherein like reference numerals are utilized to refer to like elements throughout. In the following description, for purposes of explanation, numerous specific details are set forth in order to provide a more thorough understanding of the one or more embodiments. However, in various cases, that the one or more embodiments can be practiced without these specific details.

Discussion is provided herein relative to a semiconductor for use in a quantum system, such as for use as or comprised by an arbitrary wave form generator of a quantum system. However, semiconductors described and discussed herein can be employed for other uses, such as for radio, radar and/or other signal-based applications. Description and discussion herein is therefore not limited to use in a quantum system or in the quantum space only.

According to one or more embodiments, a semiconductor device described herein can be configured to generate high-frequency pulses, such as wavelets as qubit control pulses for a quantum computer. High-frequency refers here to frequencies above 1 GHz. According to one or more embodiments, a semiconductor device described herein can be used for radar applications.

As used herein, a quantum circuit can be a set of operations, such as gates, performed on a set of real-world physical qubits with the purpose of obtaining one or more qubit measurements. A quantum processor can comprise the one or more real-world physical qubits. Operation of a quantum circuit can be facilitated, such as by a waveform generator, to produce one or more physical pulses and/or other waveforms, signals and/or frequencies to alter one or more states of one or more of the physical qubits. The altered states can be measured, thus allowing for one or more computations to be performed regarding the qubits and/or the respective altered states. The waveform generator can be controlled, such as by a respective control stage.

In current quantum computers, a respective control stage can be difficult to scale due to use of bulky room temperature equipment. For example, a 70-qubit system can employ approximately 240 arbitrary wave form generators, which each can be a bulky piece of equipment. Cabling likewise can limit scalability, such as where each qubit can employ an individual control line to the room temperature environment outside of a cryostat of the quantum computer.

Also in current quantum computers, cryogenic qubit control integrated circuits (ICs) can be based on silicon complementary metal oxide semiconductor technology (Si CMOS technology). Such technology can be limiting relative to minimum power dissipation with which the ICs can operate. That is, when qubit numbers scale upward, power per channel also can scale upward, and can be too great to dissipate conventionally.

In one or more embodiments, a qubit can be driven to an excited state, and thus controlled, such as by an arbitrary waveform generation of about 50 nanosecond (ns) pulses at around 6 gigahertz (GHz). In conventional quantum systems, such pulses can be generated using digital to analog converters (DACs) in CMOS technology, both in room temperature systems and in cryogenic IC s.

Turning now to the one or more embodiments described herein, such embodiments relate to a semiconductor device, quantum computer comprising a semiconductor device and/or method for fabricating a semiconductor device that can address one or more deficiencies of existing semiconductor technologies, such as relative to signal generation. That is, such semiconductor device can be employed by a waveform generator of a quantum system to generate one or more signals, waveforms and/or the like to affect a qubit of a quantum logic circuit (e.g., having one or more qubits). The one or more signals can be employed to drive excitation of a qubit, change a state of a qubit and/or to read out a state of a qubit.

Generally, a semiconductor device described herein can comprise a co-integrated resonant tunneling diode (RTD) and field effect transistor (FET). Such semiconductor device can generate qubit control pulses (e.g., as a wavelet generator) within standard specifications, and at a reduced power, thus also employing less power dissipation. The aforementioned combination of elements can be co-integrated along the substrate, which can allow for flow between the RTD and FET along the substrate. As used herein, flow can be signal flow, electric flow, current flow, power flow and/or the like.

In one or more embodiments, the aforementioned combination of elements (and/or layers thereof) can be arranged next to one another, in a direction along the substrate. This arrangement of at least an element of the RTD being disposed next to at least an element of the FET, along the substrate, can be referred to herein as a lateral stack.

Advantageously, such semiconductor device can provide power efficiency benefits. For example, such semiconductor device can employ less power than a conventional arbitrary waveform generator (AWG) to generate a control pulse for a qubit, such as employing about $10^4$ or even about $10^5$ lower power than a conventional AWG. Such semiconductor device can employ less power than a conventional Si CMOS solution to generate a control pulse for a qubit, such as employing about 5 times to about 10 times lower power than a conventional Si CMOS solution. Such benefits can be given due to the need for fewer active transistors in an analog signal generation scheme such as using RTDs, compared to a digital signal generation scheme using CMOS. Such benefits can be further improved by a tight co-integration on a chip level between the RTD and FET (e.g., indium phosphide FET) elements.

In addition, the RTD structure can be grown in a single growth step with the FET, as will be described in detail below. That is, fabrication can be made more efficient where a single growth step can be employed for both the RTD structure and FET.

As used herein, the term "on" and "above" can be used in a context, as is customary, to indicate orientation or relative position in a vertical or orthogonal direction to the surface of the substrate, for example in a vertical z-direction.

As used herein, the terms "lateral" and/or "laterally" can be used, as is customary, to indicate orientation generally parallel to the plane of the substrate, as opposed to generally vertically, or outwardly, from the substrate surface.

As used herein, the term(s) "vertical" and/or "vertically" can be used, as is customary, to indicate orientation generally orthogonal (e.g., vertical z-direction) to the plane of the substrate, and thus also in a direction outward from the plane of the substrate, as opposed to generally laterally along the substrate surface.

As used herein, the term(s) "arranged on/at a/the semiconductor substrate" can be understood in a broad sense and shall include embodiments according to which an intermediate layer, such as an insulating layer, can be arranged between the substrate and the respectively described layer/structure. Hence the terms "arranged on the substrate" and/or "arranged at the substrate" can comprise the meaning arranged "above the substrate".

Semiconductor devices according to one or more embodiments described herein can be integrated on Si or another substrate, for example a substrate comprising a group III-V semiconductor material.

As used herein, the term group III-V semiconductor material can be understood as a semiconductor material comprising a group III element and a group V element. As used herein, the term "group" can be replaced with "periodic group", or vice versa.

One or more embodiments are now described with reference to the drawings, where like referenced numerals are used to refer to like elements throughout. As used herein, the terms "entity", "requesting entity" and "user entity" can refer to a machine, device, component, hardware, software, smart device and/or human. In the following description, for purposes of explanation, numerous specific details are set forth in order to provide a more thorough understanding of the one or more embodiments. However, in various cases, that the one or more embodiments can be practiced without these specific details.

Generally, the subject computer processing system(s), methods, apparatuses, devices and/or computer program products can be employed to solve new problems that can arise through advancements in technology, computer networks, the Internet and/or the like.

Further, the embodiments depicted in one or more figures described herein are for illustration only, and as such, the architecture of embodiments is not limited to the systems, devices and/or components depicted therein, nor to any particular order, connection and/or coupling of systems, devices and/or components depicted therein.

Turning first generally to FIG. 1, one or more embodiments described herein can include one or more devices, systems and/or apparatuses that can facilitate executing one or more operations to facilitate generation of one or more qubit drive, excitation and/or readout pulses (e.g., signals, waveforms, wavelets and/or the like). FIG. 1 illustrates a block diagram of an example, non-limiting system 100 that facilitate operation of a quantum circuit such as by employing a semiconductor device according to the present disclosure as a waveform generator and/or as an element of a waveform generator of a quantum system.

The following/aforementioned description(s) refer(s) to the operation of a single quantum program from a single quantum job request. This operation can include one or more readouts from cryogenic environment electronics within cryogenic chamber 116 by room temperature control/readout electronics 112 external to the cryogenic chamber 116. That is, one or more of the processes described herein can be scalable, also such as including additionally, and/or alternatively, execution of one or more quantum programs and/or quantum job requests in parallel with one another. Scalability of efficient readout can be enabled by employing semiconductor devices 111 in quantity.

In one or more embodiments, the non-limiting system 100 can be a hybrid system and thus can include both one or more classical systems, such as a quantum program implementation system, and one or more quantum systems, such as the quantum system 101. In one or more other embodiments, the quantum system 101 can be separate from, but function in combination with, a classical system.

In such case, one or more communications between one or more components of the non-limiting system 100 and a classical system can be facilitated by wired and/or wireless means including, but not limited to, employing a cellular network, a wide area network (WAN) (e.g., the Internet), and/or a local area network (LAN). Suitable wired or wireless technologies for facilitating the communications can include, without being limited to, wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (Ipv6 over Low power Wireless Area Networks), Z-Wave, an ANT, an ultra-wideband (UWB) standard protocol and/or other proprietary and/or non-proprietary communication protocols.

In one or more other embodiments, the classical system can provide a quantum job request 104, qubit mapping, quantum circuit to be executed and/or the like. Such classical system can analyze the one or more quantum measurement readouts 120. Further, such classical system can manage a queueing of quantum circuits to be operated on the one or more qubits of the quantum logic circuit of a respective quantum system 101.

Figure 8:
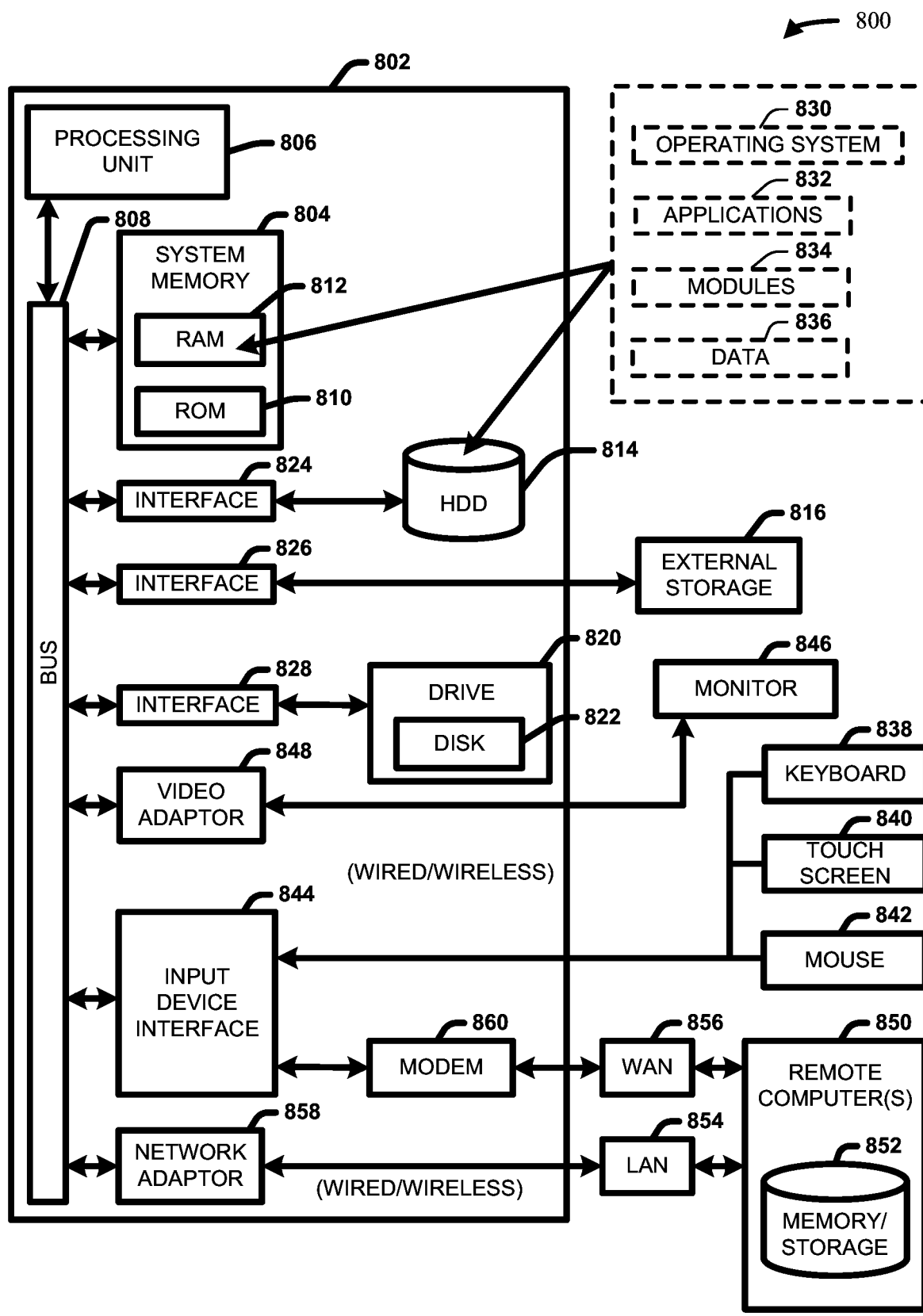
FIG. 8 illustrates a block diagram of an example, non-limiting, operating environment in which one or more embodiments described herein can be facilitated.

For example, in one or more embodiments, the non-limiting systems described herein, such as non-limiting system 100 as illustrated at FIG. 1, and/or systems thereof, can further comprise, be associated with and/or be coupled to one or more computer and/or computing-based elements described herein with reference to an operating environment, such as the operating environment 800 illustrated at FIG. 8. In one or more described embodiments, computer and/or computing-based elements can be used in connection with implementing one or more of the systems, devices, components and/or computer-implemented operations shown and/or described in connection with FIG. 1 and/or with other figures described herein.

The quantum system 101 (e.g., quantum computer system, superconducting quantum computer system and/or the like) can employ quantum algorithms and/or quantum circuitry, including computing components and/or devices, to perform quantum operations and/or functions on input data to produce results that can be output to an entity. The quantum circuitry can comprise quantum bits (qubits), such as multi-bit qubits, physical circuit level components, high level components and/or functions. The quantum circuitry can comprise physical pulses that can be structured (e.g., arranged and/or designed) to perform desired quantum functions and/or computations on data (e.g., input data and/or intermediate data derived from input data) to produce one or more quantum results as an output. The quantum results, e.g., quantum measurement 120, can be responsive to the quantum job request 104 and associated input data and can be based at least in part on the input data, quantum functions and/or quantum computations.

In one or more embodiments, the quantum system 101 can comprise one or more quantum components, such as a quantum operation component 103, a quantum processor 106, quantum readout/control electronics 112, a waveform generator 110, and/or a quantum logic circuit 108 comprising one or more qubits (e.g., qubits 107A, 107B and/or 107C), also referred to herein as qubit devices 107A, 107B and 107C.

The quantum processor 106 can be any suitable processor. The quantum processor 106 can generate one or more instructions for controlling the one or more processes of the quantum logic circuit 108 and/or waveform generator 110.

The quantum operation component 103 can obtain (e.g., download, receive, search for and/or the like) a quantum job request 104 requesting execution of one or more quantum programs. The quantum operation component 103 can determine one or more quantum logic circuits, such as the quantum logic circuit 108, for executing the quantum program. The request 104 can be provided in any suitable format, such as a text format, binary format and/or another suitable format. In one or more embodiments, the request 104 can be received by a component other than a component of the quantum system 101, such as a by a component of a classical system coupled to and/or in communication with the quantum system 101.

The waveform generator 110 can perform one or more waveform operations for operating and/or affecting one or more quantum circuits on the one or more qubits 107A, 107B and/or 107C. For example, the waveform generator 110 can operate one or more qubit effectors, such as qubit oscillators, harmonic oscillators, pulse generators and/or the like to cause one or more pulses to stimulate and/or manipulate the state(s) of the one or more qubits 107A, 107B and/or 107C comprised by the quantum system 101.

The waveform generator 110 can comprise one or more semiconductor devices 111 having a respective closely co-integrated resonant tunneling diode (RTD) and field effect transistor (FET). This co-integration can provide for flow along a respective substrate or base surface (e.g., where the substrate is removed from, if the substrate is removed) between the RTD and FET.

Employing the semiconductor device 111, such as a semiconductor chip, the waveform generator 110 can generate a qubit control pulse employing low power, such as less than 1 mW/qubit. In quantity, the power employed by such semiconductor devices can more readily be cooled by a cooling system (e.g., dissipated), such as inside a respective cryogenic chamber.

The waveform generator 110, such as in combination with the quantum processor 106, can execute operation of a quantum logic circuit on one or more qubits of the circuit (e.g., qubit 107A, 107B and/or 107C). In response, the quantum operation component 103 can output one or more quantum job results, such as one or more quantum measurements 120, in response to the quantum job request 104.

The quantum logic circuit 108 and a portion or all of the waveform generator 110 and/or quantum processor 106 can be contained in a cryogenic environment, such as generated by a cryogenic chamber 116, such as a dilution refrigerator. The semiconductor device 111 can thus be employed in a cryogenic environment. Indeed, a signal can be generated by the waveform generator 110 within the cryogenic chamber 116 to affect the one or more qubits 107A-C. Where qubits 107A, 107B and 107C are superconducting qubits, cryogenic temperatures, such as about 4K or lower can be employed to facilitate function of these physical qubits. Accordingly, the elements of the waveform generator 110, including the semiconductor device 111, also are to be constructed to perform at such cryogenic temperatures.

Turning now to FIGS. 2a to 5c, illustrated are enlarged cross-sectional views and corresponding top views of initial, intermediate and prefinal or final semiconductor structures formed during stages of fabrication methods according to embodiments of the present disclosure. Such final semiconductor structures can be employed as semiconductor device 111, as described above relative to a quantum system 101, and/or can be employed as semiconductor devices for other suitable purposes, such as signal-based or signal-generating purposes.

FIGS. 2a-2d illustrate enlarged 3-dimensional views of initial, intermediate and prefinal or final structures formed during the stages of fabrication methods according to one or more embodiments described herein.

Figure 2A:
FIG. 2a shows a 3-dimensional view of an initial structure comprising a sacrificial layer on a semiconductor substrate, in accordance with one or more embodiments described herein.

FIG. 2a shows a 3-dimensional view of an initial structure 201. The initial structure 201 can comprise a substrate 210. The substrate 210 can comprise a semiconductor material and can be a bulk semiconductor substrate. The substrate 210 can be embodied as a crystalline semiconductor or a compound semiconductor wafer of a large diameter. The substrate 210 can comprise, for example, a material from group IV of the periodic table as semiconductor material. Materials of group IV can include, for example, silicon, germanium, mixed silicon and germanium, mixed silicon and carbon, mixed silicon germanium and carbon, and/or the like. For example, the substrate 210 can be a crystalline silicon wafer that is used in the semiconductor industry. For the following exemplary description, it is assumed that the substrate comprises Si, which is illustrated by diagonal stripes. The substrate 210 is thus illustrated with diagonal stripes.

The structure 201 further can comprise an insulating layer 211 on the substrate 210. The insulating layer 211 can be embodied, for example, as a dielectric layer. The insulating layer 211 can be formed by suitable methods, as for example thermal oxidation, chemical vapor deposition (CVD), plasma enhanced CVD (PECVD), atomic layer deposition, chemical solution deposition, MOCVD, evaporation, sputtering and other deposition processes. Examples of such dielectric material include, but are not limited to: $SiO_2$, $Si_3N_4$, $Al_2O_3$, AlON, $Ta_2O_5$, $TiO_2$, $La_2O_3$, $SrTiO_3$, $LaAlO_3$, $ZrO_2$, $Y_2O_3$, $Gd_2O_3$, MgO, MgNO, Hf-based materials and combinations including multilayers thereof.

For the following exemplary description, it is assumed that the insulating layer 211 comprises $SiO_2$ which is illustrated by horizontal stripes.

The structure 201 further can comprise a sacrificial layer 212 on the insulating layer 211. The sacrificial layer 212 can comprise a seed material. The seed material can be a periodic group-IV material. The seed material can be Si. According to embodiments, the substrate 210, the insulating layer 211 and the sacrificial layer 212 can be embodied as a silicon-on-insulator (SOI) wafer. According to other embodiments, the seed material can be a periodic group III-V material, e.g. gallium arsenide (GaAs), indium arsenide (InAs) and/or indium phosphide (InP). The sacrificial layer is illustrated with a dotted pattern.

The thicknesses of the substrate 210, the insulating layer 211 and the sacrificial layer 212 can be any suitable thicknesses.

Figure 2B:
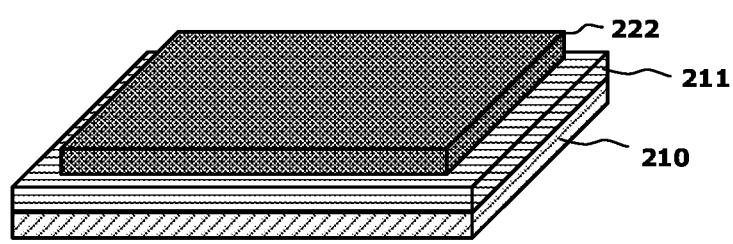
FIG. 2b illustrates a 3-dimensional view of a structure which has been formed from the structure of FIG. 2a by patterning the sacrificial layer, thereby forming a sacrificial structure, being a starting structure of a semiconductor device, in accordance with one or more embodiments described herein.

FIG. 2b illustrates a 3-dimensional view of a structure 202. The structure 202 has been formed from the structure 201 by patterning the sacrificial layer 212. The patterning of the sacrificial layer 212 can be performed by one or more lithography and etching steps. The etching can be based on HBr chemistry, which in Si photonics can have a particular advantage of providing smooth sidewalls.

The patterned sacrificial layer 212 forms a sacrificial structure 222. The sacrificial structure 222 can form the inner part of a template structure to be formed subsequently and can be replaced partly by one or more other semiconductor materials, such as by periodic group III-V semiconductor materials. In one or more embodiments, the periodic group III-V semiconductor materials can comprise undoped and/or doped indium gallium arsenide (InGaAs), aluminum arsenide (AIAs), gallium arsenide (GaAs), indium arsenide (InAs) and/or indium phosphide (InP).

Figure 2C:
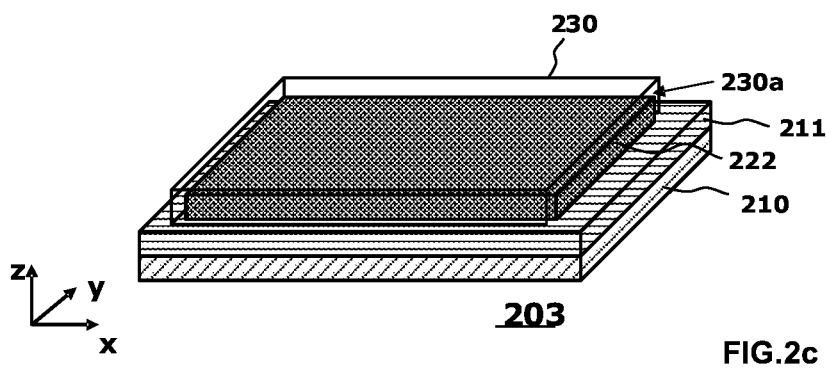
FIG. 2c illustrates a 3-dimensional view of a structure by encapsulating the sacrificial structure of FIG. 2b, in accordance with one or more embodiments described herein.

FIG. 2c illustrates a 3-dimensional view of a structure 203. The structure 203 has been formed from the structure 202 by encapsulating the sacrificial structure 222. More particularly, the sacrificial structure 222 can be covered with a template layer 230 of a dielectric material. In the exemplary embodiment of FIG. 2c it is assumed that the template layer 230 comprises SiO2. The template layer 230 is illustrated in a transparent manner to facilitate the illustration of aspects of one or more embodiments described herein. Furthermore, one side of the template layer 230 has been opened. Thereby, an opening 230a (e.g., right side of 230 at FIG. 2c) has been formed in the template layer 230. More particularly, the SiO2 of the template layer 230 has been etched, e.g. by reactive ion etching (RIE), to give access to the sacrificial Si material of the sacrificial structure 222.

Figure 2D:
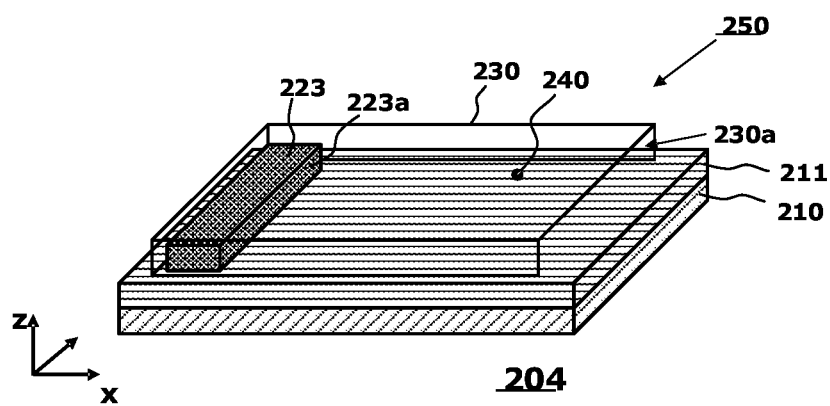
FIG. 2d illustrates a 3-dimensional view of a template structure which has been formed from the structure of FIG. 2c by a selective removal of a part of the seed material of the sacrificial structure back to a desired remaining portion of the sacrificial structure, in accordance with one or more embodiments described herein.

FIG. 2d illustrates a 3-dimensional view of a structure 204. The structure 203 has been formed from the structure 204 by a selective removal of a part of the seed material of the sacrificial structure 222 back to a desired remaining portion of the sacrificial structure 222. The remaining portion forms a seed structure 223 providing a seed surface 223a. The selective removal can form a hollow cavity 240 of a template structure 250 for subsequent growth steps. The selective removal can be performed by a selective etching technique. The template structure 250 can comprise the opening 230a, the cavity 240, the seed structure 223 with the seed surface 223a and the template layer 230.

According to one or more embodiments, depending on the desired shape of extension of the seed surface 223a in the y-direction, the template structure 250 can be fabricated as a funnel structure with a smaller seed. This can minimize issues relating to lattice mismatch.

Figure 3A:
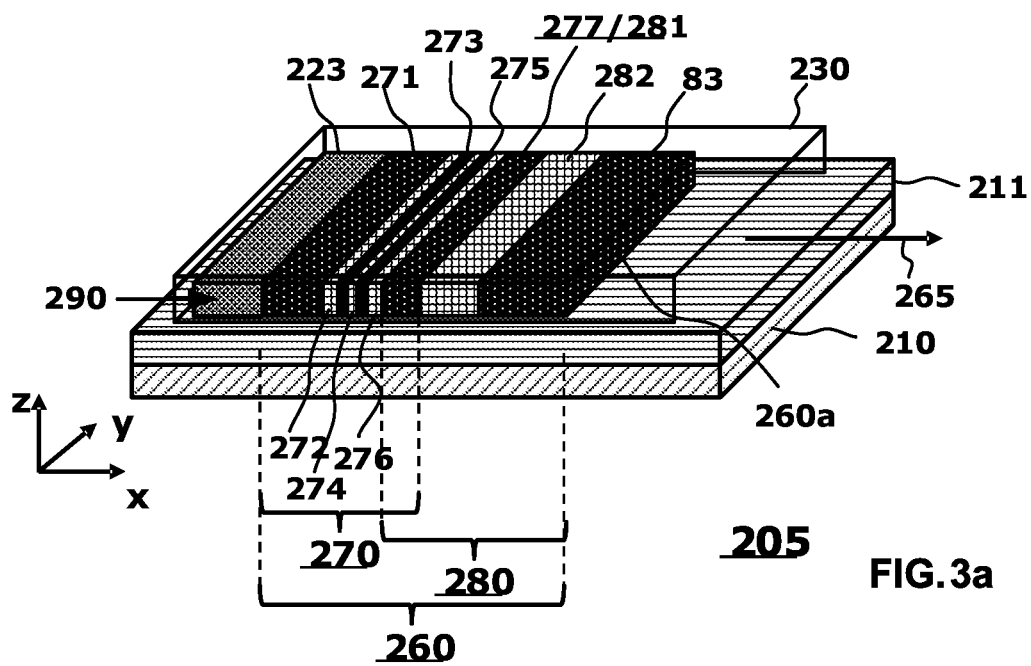
FIG. 3a illustrates a 3-dimensional view of a structure which has been formed from the structure of FIG. 1d by growing within the template structure a semiconductor structure comprising a resonant tunneling diode and a field effect transistor, in accordance with one or more embodiments described herein.

FIG. 3a illustrates a 3-dimensional view of a structure 205. The structure 205 has been formed from the structure 204 by growing within the template structure 250, and more particularly within the cavity 240, a semiconductor structure 260 from the seed surface 223a. The growth of the semiconductor structure 260 can comprise a nucleation phase and a growth phase of the semiconductor structure 260. The growth can be performed in a lateral growth direction 265 in parallel to the semiconductor substrate 210 and hence in a lateral direction (e.g., along the substrate 210).

An exposed surface 260a of the semiconductor structure 260 can establish a front surface 260a during the growth of the semiconductor structure 260.

The semiconductor structure 260 can comprise a plurality of periodic group III-V semiconductor materials. In one or more embodiments, the periodic group III-V semiconductor materials can comprise undoped and/or doped indium gallium arsenide (InGaAs), aluminum arsenide (AIAs), gallium arsenide (GaAs), indium arsenide (InAs) and/or indium phosphide (InP).

The growing of the semiconductor structure 260 can be performed, for example, by metal organic chemical vapor deposition (MOCVD), by atmospheric pressure CVD, by low or reduced pressure CVD, by ultra-high vacuum CVD, by molecular beam epitaxy (MBE), by atomic layer deposition (ALD) or by hydride vapor phase epitaxy.

The semiconductor structure 260 can comprise an arrangement having a plurality of layers, such as a plurality of diode layers and a plurality of transistor layers. The plurality of diode layers can be arranged next to one another along the substrate 210. The plurality of transistor layers can be arranged next to one another along the substrate 210. The plurality of diode layers can be arranged next to the plurality of transistor layers along the substrate 210. At least one layer of the plurality of diode layers and at least one layer of the plurality of transistor layers can be contiguous with one another. Put another way, transition between the layers of the semiconductor structure 250 can be in the laterally-extending growth direction 265. Indeed, the layers can be arranged next to one another such that the full semiconductor structure 260 can laterally-extend along the substrate 210. In this way, flow between the plurality of diode layers and the plurality of transistor layers can travel in a direction along the substrate.

In one or more embodiments, the plurality of diode layers can be of a resonant tunneling diode 270, and the plurality of transistor layers can be of a field effect transistor 280.

More particularly, the semiconductor structure 260 can comprise a collector layer 271, a barrier layer 272, a first quantum well layer 273, a barrier layer 274, a second quantum well layer 275, a barrier layer 276 and an emitter layer 277.

The collector layer 271, the barrier layer 272, the first quantum well layer 273, the barrier layer 274, the second quantum well layer 275, the barrier layer 276 and the emitter layer 277 establish the diode layers of the resonant tunneling diode 270.

The collector layer 271 is illustrated with a dotted pattern, the barrier layer 272 with a grid pattern, the first quantum well layer 273 with a black color, the barrier layer 274 with a grid pattern, the second quantum well layer 275 with a black color, the barrier layer 276 with a grid pattern and the emitter layer 277 with a dotted pattern.

The semiconductor structure 260 further can comprise a drain layer 281, a channel layer 282 and a source layer 283. The drain layer 281, the channel layer 282 and the source layer 283 can establish the transistor layers of the field effect transistor 280.

The drain layer 281 is illustrated with a dotted pattern, the channel layer 282 with a grid pattern and the source layer 283 with a dotted pattern.

The plurality of layers 271-277 (e.g., of the RTD 270) and 281-283 (e.g., of the FET 280) are arranged next to each other along the substrate 210. Thus, the RTD 270 layers are arranged next to the FET 280 layers, and thus are provided co-integrated in a common layer 290 (FIG. 3b) along the substrate 210.

According to one or more embodiments, the emitter layer 277 and the drain layer 281 are formed by a common layer. In other words, the emitter layer 277 and the drain layer 281 can be identical and can provide functionality for both the resonant tunneling diode 270 and the field effect transistor 280.

According to one or more embodiments, the resonant tunneling diode 270 and/or the field effect transistor 280 can be implemented by using periodic group III-V semiconductor materials. More particularly, the field effect transistor 280 can be a III-V field effect transistor comprising periodic group III-V semiconductor materials and the resonant tunneling diode 280 can be a III-V resonant tunneling diode comprising periodic group III-V semiconductor materials. The field effect transistor 280 can be a metal oxide semiconductor field effect transistor (MOSFET). The field effect transistor 280 can be a high-frequency transistor.

In one or more embodiments, the periodic group III-V semiconductor materials can comprise n-doped and/or p-doped layers. As used herein, doping can be understood as intentional introduction of impurities into an intrinsic semiconductor for the purpose of modulating electrical, optical and/or structural properties of the semiconductor. Doping a semiconductor can introduce allowed energy states within the band gap, but very close to the energy band, such as equal to or within 10 meV, that can correspond to the dopant type. Positive or p-type doping can introduce free holes in the valence band, whereas negative or n-type doping can introduce free electrons within the conduction band.

The introduction of dopants can have an effect of shifting conduction and valence energy bands relative to the Fermi level. In an n-type semiconductor, the Fermi level is close to the conductance band or within the conductance band in a degenerate n-type semiconductor. For a p-type semiconductor, the Fermi level is close to the or within the Valance band. Doping densities in typically doped semiconductors can range from about $5 \times 10^{18}$ cm$^{-3}$ to about $10^{20}$ cm$^{-3}$, depending on the material and density of states. Whereas semiconductors can be rarely perfectly intrinsic, intrinsic in the electrical sense can mean that semiconductors are not conductive. Typically, the doping level can be about $10^{15}$ to about $10^{16}$ cm$^{-3}$.

In one or more embodiments, the periodic group III-V semiconductor materials can comprise undoped and/or doped indium gallium arsenide (InGaAs), aluminum arsenide (AlAs), gallium arsenide (GaAs), indium arsenide (InAs) and/or indium phosphide (InP).

According to one or more embodiments, the collector layer 271 can comprise negatively doped indium gallium arsenide (InGaAs), the barrier layers 272, 274 and 276 can comprise undoped indium gallium arsenide (InGaAs), the first quantum well layer 273 and the second quantum well layer 275 can comprise aluminum arsenide (AlAs), and the emitter layer 277 can comprise negatively doped InGaAs.

According to one or more embodiments, the drain layer 281 can comprise a negatively doped InGaAs, the channel layer 282 can comprise undoped InGaAs and the source layer 283 can comprise negatively doped InGaAs.

According to one or more embodiments, the chosen pattern fill of the respective layer can indicate a corresponding material of the layer. In this respect, the dotted pattern of the seed structure 223 can indicate Si, the dotted pattern of the collector layer 271, the emitter layer 277, the drain layer 281 and the source layer 283 can indicate negatively doped InGaAs, the grid pattern of the barrier layers 272, 274 and 276 and the channel layer 282 can indicate undoped InGaAs and the black color of the first quantum well layer 273 and the second quantum well layer 275 can indicate AlAs according to embodiments.

Figure 3B:
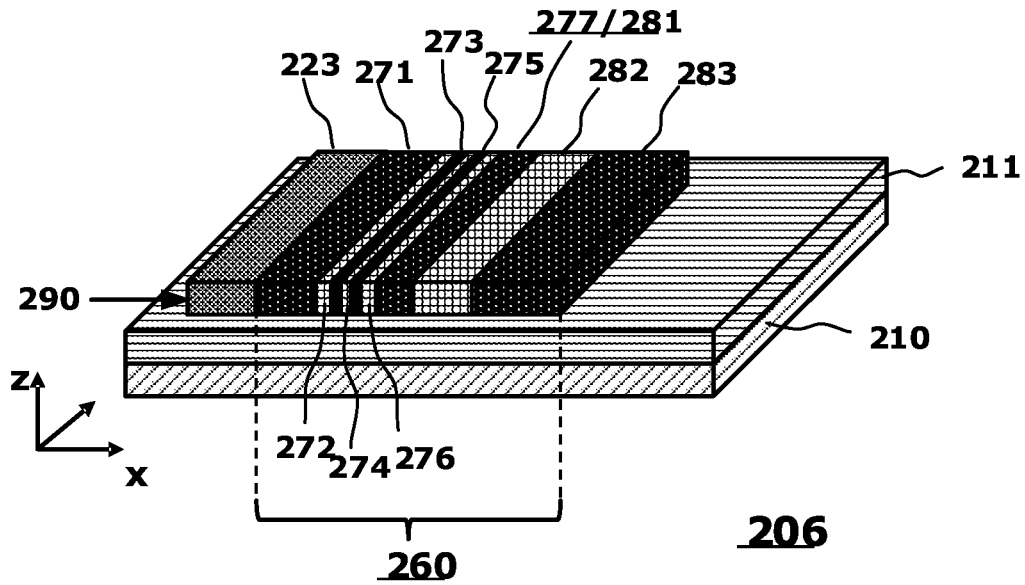
FIG. 3b illustrates a 3-dimensional view of a structure which has been formed from the structure of FIG. 3a by removing the template structure, in accordance with one or more embodiments described herein.

FIG. 3b illustrates a 3-dimensional view of a structure 206. The structure 206 has been formed from the structure 205 by removing the template layer 230, for example by suitable etching techniques. This has released the semiconductor structure 260.

The semiconductor structure 260 can then be further processed in view of the envisaged application of the final device, such as by providing electrical contacts. This will be explained in more detail below.

Turning now to FIGS. 4a to 5b, FIG. 4a illustrates a cross-sectional view of a structure 401. The cross-sectional view 401 corresponds to the 3-dimensional view 206 of FIG. 3b.

Accordingly, it comprises the semiconductor substrate 210, the insulating layer 211, the seed structure 223 and the semiconductor structure 260 comprising the various layers of the resonant tunneling diode 270 and of the field effect transistor 280.

Figure 4A:
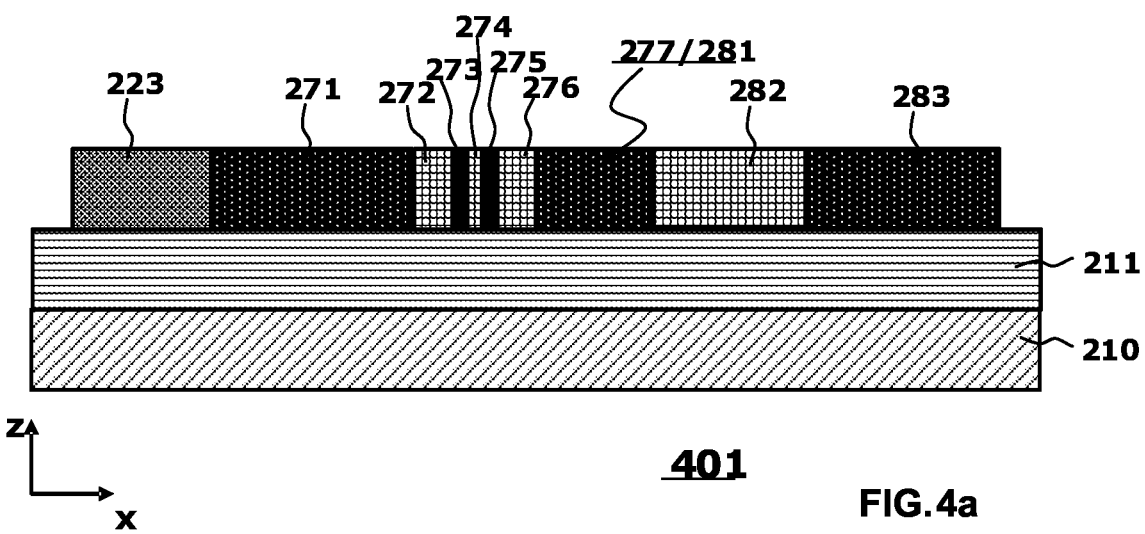
FIG. 4a illustrates a cross-sectional view of the structure corresponding to the 3-dimensional view of FIG. 3b, in accordance with one or more embodiments described herein.
Figure 4B:
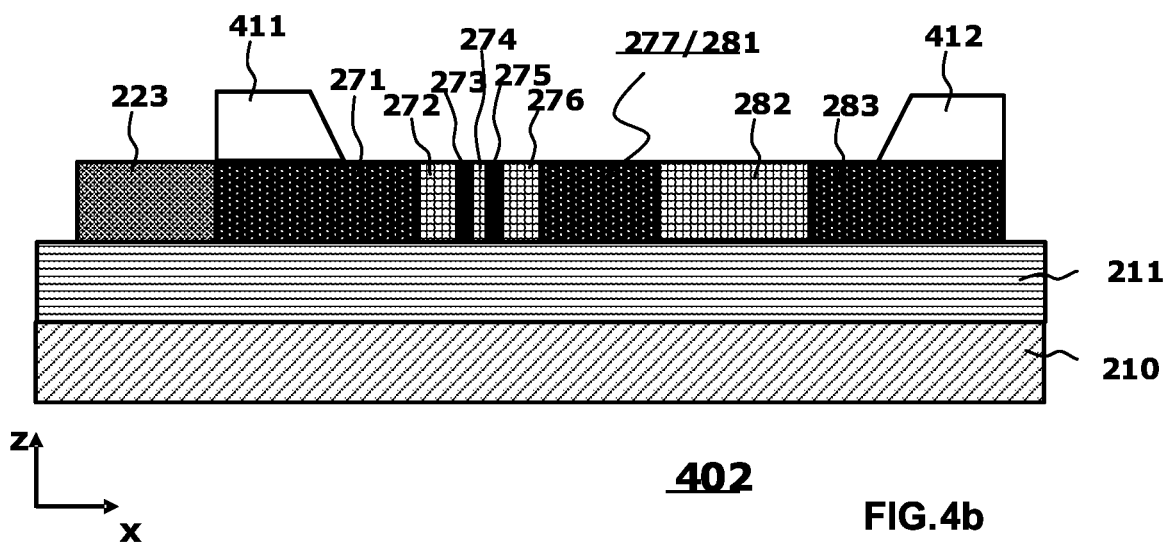
FIG. 4b illustrates a cross-sectional view of a structure which has been formed from the structure of FIG. 4a by forming drain and source contact layers, in accordance with one or more embodiments described herein.

FIG. 4b illustrates a cross-sectional view of a structure 402. The structure 402 has been formed from the structure 401 by forming a contact layer 411 on the collector layer 271 and by forming a contact layer 412 on the source layer 283. The contact layer 411 and/or the contact layer 412 can comprise a metal and can be formed by metal deposition techniques.

Figure 5A:
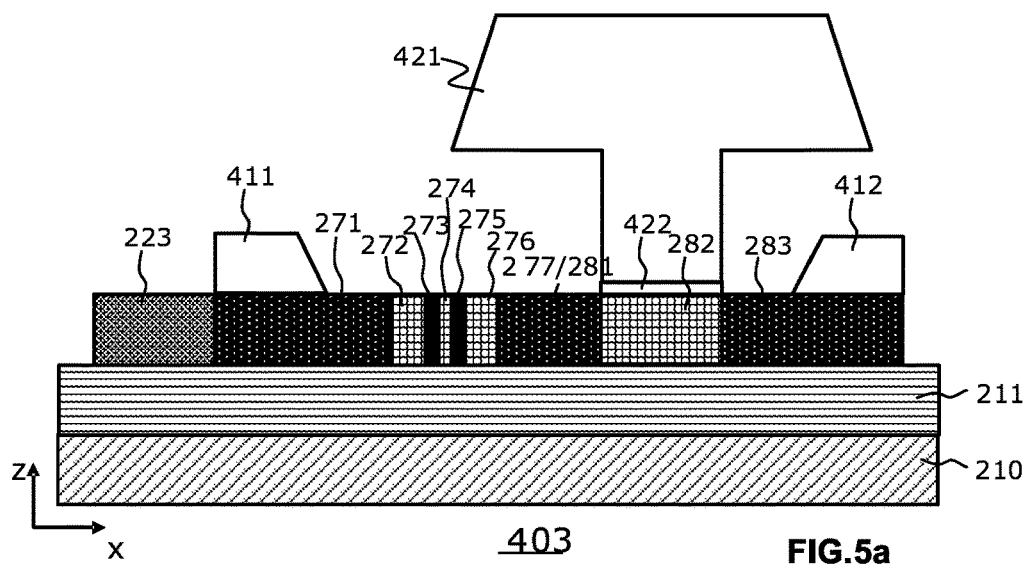
FIG. 5a illustrates a cross-sectional view of a structure which has been formed from the structure of FIG. 4b by forming a gate oxide layer and a gate contact layer, in accordance with one or more embodiments described herein.

FIG. 5a illustrates a cross-sectional view of a structure 403. The structure 403 has been formed from the structure 403 by forming a gate oxide layer 422 on the channel layer 282 and by forming a gate contact layer 421 on the gate oxide layer 422.

Figure 5B:
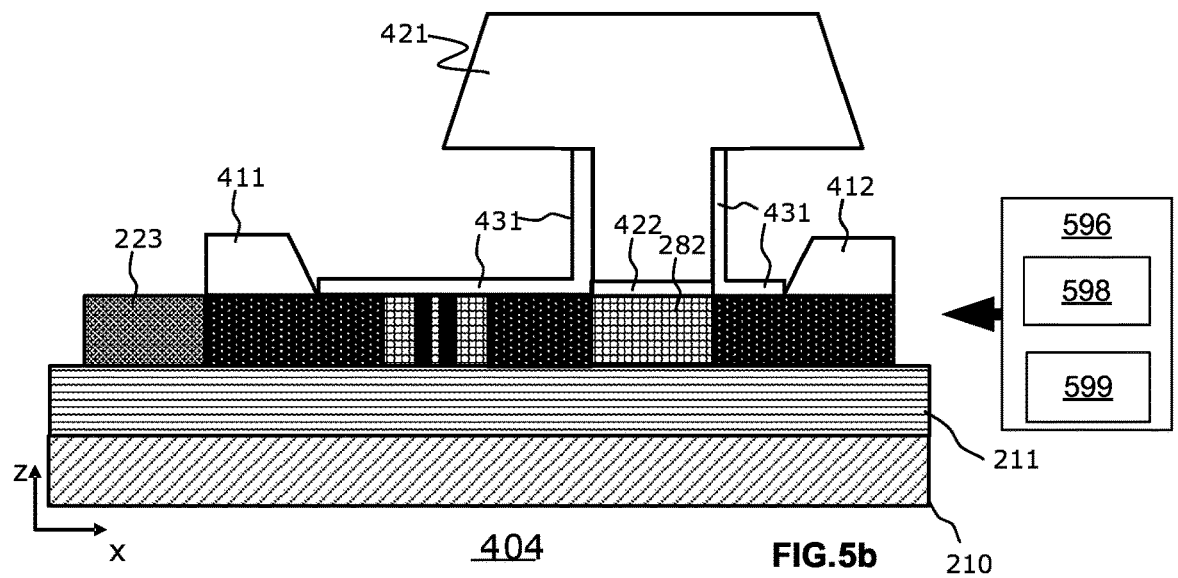
FIG. 5b illustrates a cross-sectional view of a semiconductor structure which has been formed from the structure of FIG. 5a by forming insulating layers, in accordance with one or more embodiments described herein.

FIG. 5b illustrates a cross-sectional view of a structure 404. The structure 404 has been formed from the structure 403 by forming insulating layers 431 on the structure 403.

Also as shown at FIG. 5b, but described relative to any of FIGS. 2a-5b, in one or more embodiments, one or more operations for fabricating the one or more semiconductor devices described herein, such as the semiconductor device 209, can be performed by a manufacturing system, such as a manufacturing system 596 comprising one or more manufacturing devices 598, where the manufacturing system 596 is operatively coupled to a processor 599 for at least partially controlling the one or more operations. The processor 599 can be any suitable processor. Discussion proved below with respect to processor 806 can be at least partially equally applicable to the processor 599.

In one or more embodiments, the manufacturing system 596 can be configured, such as by one or more operations performed by one or more of the manufacturing devices 598 in view of one or more instructions provided by the processor 599, to construct the semiconductor device 209, such as relative to a substrate. The manufacturing devices 598 can, perform, among other operations, one or more deposition, transfer, etching, cutting, placement, removal, radiation, irradiation, adhesive and/or metallization operations.

Figure 5C:
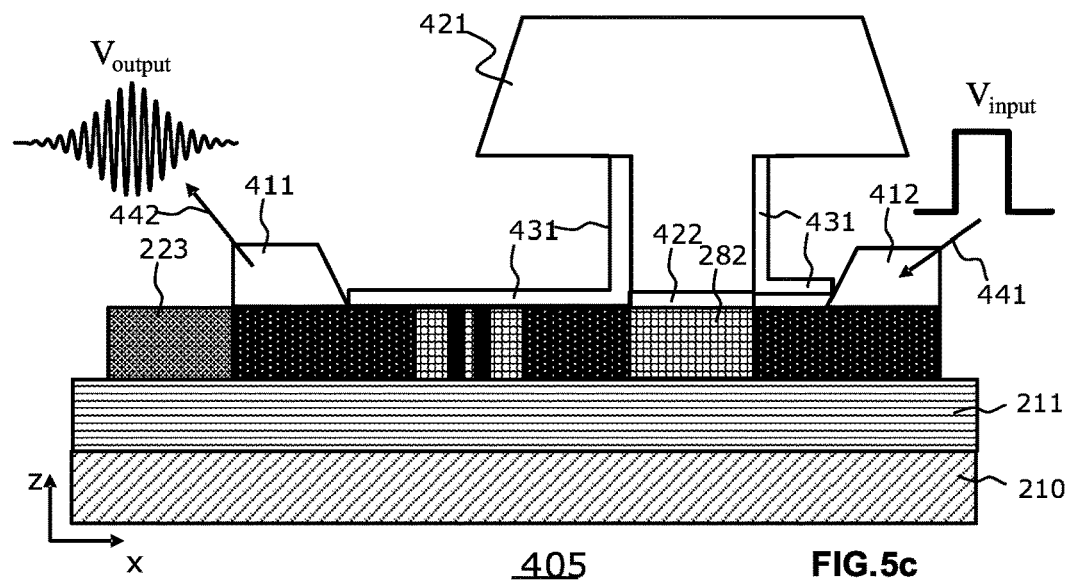
FIG. 5c corresponds to the semiconductor structure of FIG. 5b and shows in addition the operation of the semiconductor structure as pulse generator, in accordance with one or more embodiments described herein.

FIG. 5c illustrates a cross-sectional view of a structure 405. The structure 405 corresponds to the structure 404 and shows in addition the operation of the structure 405 as pulse generator.

More particularly, the contact layer 412 receives input pulses, such as rectangular input pulses 441. The semiconductor structure 405 is configured to produce or in other words generate in response output pulses at the contact layer 411, such as wavelets 442.

In order to achieve short-pulse high-frequency oscillations, a low-parasitic integrated circuit can be used according to one or more embodiments.

In one or more of the afore described semiconductor device embodiments, the fabricated semiconductor structure can comprise a gain structure. Such a gain structure can be epitaxially grown and can extend in a lateral direction of the substrate, more particularly in the x-y-plane. The x-y-plane can be arranged in parallel to the underlying substrate. The embodied gain structure can include a doping profile which can form a p-i-n-structure. A p-i-n-structure is a structure having an intrinsic region arranged between a p-doped region and a n-doped region.

Figure 6:
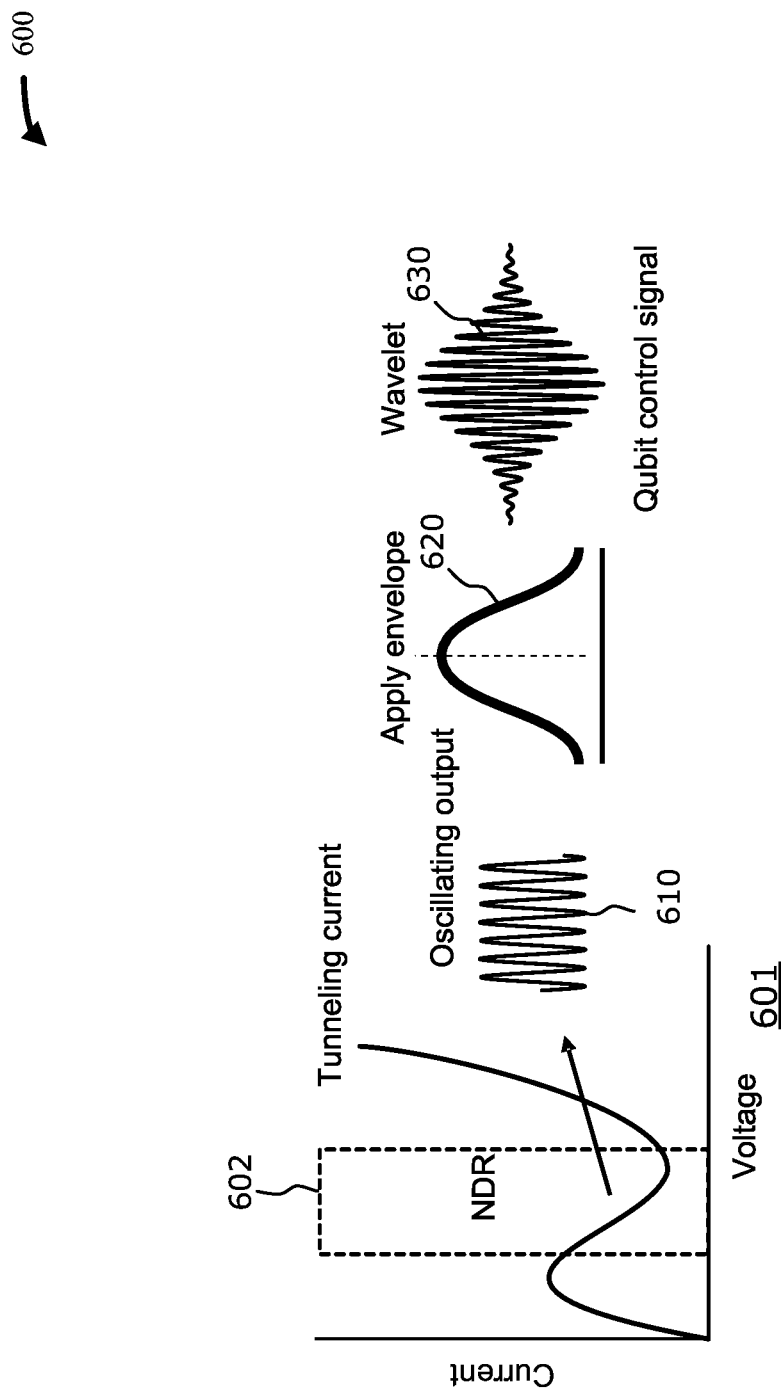
FIG. 6 illustrates the functionality of a semiconductor device, in accordance with one or more embodiments described herein.

FIG. 6 illustrates the functionality of semiconductor devices according to one or more embodiments described herein which are configured as pulse generators, such as wavelet generators, in more detail.

For example, FIG. 6 shows a voltage-current characteristic 601 of a resonant tunneling diode according to one or more embodiments described herein. The voltage-current characteristic 601 of the resonant tunneling diode has an area 602 with a negative differential resistance (NDR). Such a characteristic of a resonant tunneling diode can be used to generate an oscillating output signal 610. By applying an envelope 620 to the oscillating output 610 of the resonant tunneling diode, a wavelet 630 can be generated which can be used as qubit control pulse. The envelope 620 can be Gaussian or also arbitrary. A frequency of the wavelets 630 can be in the range between about 4 GHz and about 20 GHz and the corresponding pulse can have a length between about 20 ns and about 100 ns. To achieve short-pulse high-frequency oscillations, a low-parasitic integrated circuit can be used.

Figure 7:
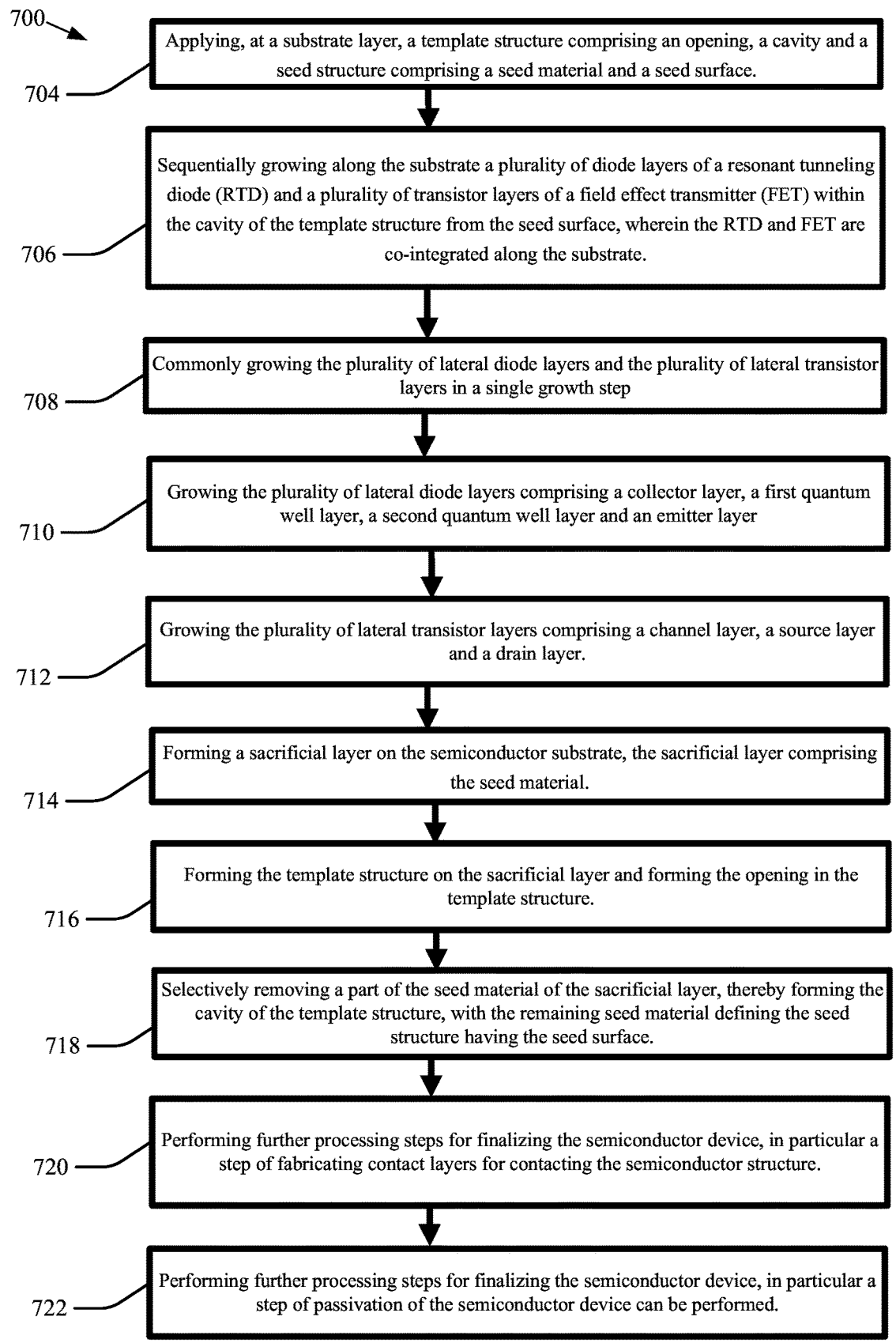
FIG. 7 illustrates a flow diagram of an example method of fabrication of a semiconductor device, in accordance with one or more embodiments described herein.

Next, FIG. 7 illustrates a flow diagram of an example, non-limiting method 700 that can facilitate a process to fabricate a semiconductor device, such as the semiconductor devices 209 of FIG. 5b. While the non-limiting method 600 is described relative to the semiconductor device 209 of FIG. 5b, the non-limiting method 600 can be applicable also to other systems and/or devices described herein, such as the semiconductor device 208 of FIG. 5a. Repetitive description of like elements and/or processes employed in respective embodiments is omitted for sake of brevity.

At 704, the non-limiting method 700 can comprise applying, at a substrate layer, a template structure comprising an opening, a cavity and a seed structure comprising a seed material and a seed surface.

At 706, the non-limiting method 700 can comprise sequentially growing along the substrate a plurality of diode layers of a resonant tunneling diode (RTD) and a plurality of transistor layers of a field effect transmitter (FET) within the cavity of the template structure from the seed surface, wherein the RTD and FET are co-integrated along the substrate.

At 708, the non-limiting method 700 can comprise commonly growing the plurality of diode layers and the plurality of transistor layers in a single growth step.

At 710, the non-limiting method 700 can comprise growing the plurality of diode layers comprising a collector layer, a first quantum well layer, a second quantum well layer and an emitter layer.

At 712, the non-limiting method 700 can comprise growing the plurality of transistor layers comprising a channel layer, a source layer and a drain layer.

At 714, the non-limiting method 700 can comprise forming a sacrificial layer on the semiconductor substrate, the sacrificial layer comprising the seed material.

At 716, the non-limiting method 700 can comprise forming the template structure on the sacrificial layer and forming the opening in the template structure.

At 718, the non-limiting method 700 can comprise selectively removing a part of the seed material of the sacrificial layer, thereby forming the cavity of the template structure, with the remaining seed material defining the seed structure having the seed surface.

By means of 714, 716 and 718, a template structure can be fabricated or in other words provided as shown in FIG. 2d. The template structure comprises an opening, a cavity and a seed structure. The seed structure comprises a seed material and a seed surface for a subsequent growth of a semiconductor structure within the cavity of the template structure.

At 720, the non-limiting method 700 can comprise performing further processing steps for finalizing the semiconductor device, in particular a step of fabricating contact layers for contacting the semiconductor structure.

At 722, the non-limiting method 700 can comprise performing further processing steps for finalizing the semiconductor device, in particular a step of passivation of the semiconductor device can be performed.

In general, the versatility of fabrication methods according to embodiments described herein can allow any combination of group III-V semiconductor materials to grow in the template structure, including embedded quantum wells, quantum dots, quantum wires, doped and/or intrinsic semiconductor layers as well as heterojunctions.

For simplicity of explanation, the computer-implemented and non-computer-implemented methodologies provided herein are depicted and/or described as a series of acts. The subject innovation is not limited by the acts illustrated and/or by the order of acts, for example acts can occur in one or more orders and/or concurrently, and with other acts not presented and described herein. Furthermore, not all illustrated acts can be utilized to implement the computer-implemented and non-computer-implemented methodologies in accordance with the described subject matter. In addition, the computer-implemented and non-computer-implemented methodologies could alternatively be represented as a series of interrelated states via a state diagram or events. Additionally, the computer-implemented methodologies described hereinafter and throughout this specification are capable of being stored on an article of manufacture to facilitate transporting and transferring the computer-implemented methodologies to computers. The term article of manufacture, as used herein, is intended to encompass a computer program accessible from any computer-readable device or storage media.

While illustrative examples are given above, it will be appreciated that the basic fabrication steps described above can be used to produce semiconductor structures of other materials, shapes and sizes. Materials and processing techniques can be selected as appropriate for a given embodiment, and suitable choices will be readily apparent to those skilled in the art.

While particular examples have been described above, numerous other embodiments can be envisaged. The seed surfaces for growing the semiconductor structures can be preferably crystalline seed surfaces, but can according to other embodiments additionally and/or alternatively be provided by amorphous surfaces. If the seed has a well-defined crystalline orientation and if the crystal structure of the seed is a reasonable match to that of the growing crystal (for example a III-V compound semiconductor), the growing crystal can adapt this orientation. If the seed is amorphous and/or has an undefined crystal orientation, the growing crystal can be single crystalline but its crystal orientation can be random.

The disclosed semiconductor structures and/or circuits can be part of a semiconductor chip. The resulting integrated circuit chips can be distributed by the fabricator in raw wafer form (that is, as a single wafer that has multiple unpackaged chips), as a bare die, or in a packaged form. In the latter case, the chip can be mounted in a single chip package (such as a plastic carrier, with leads that are affixed to a motherboard or other higher level carrier) or in a multichip package (such as a ceramic carrier that has either or both surface interconnections or buried interconnections). In any case, the chip can be integrated with other chips, discrete circuit elements and/or other signal processing devices as part of either an intermediate product, such as a motherboard, and/or an end product. The end product can be any product that can include one or more integrated circuit chips.

In summary, one or more systems, devices and/or methods provided herein relate to a device that can facilitate generation of a pulse to affect a qubit and to a method that can facilitate fabrication of a semiconductor device. The semiconductor device can comprise an RTD and an FET co-integrated in a common layer extending along a substrate. A method for fabricating the semiconductor device can comprise applying, at a substrate layer, a template structure comprising an opening, a cavity and a seed structure comprising a seed material and a seed surface, and sequentially growing along the substrate a plurality of diode layers of an RTD and a plurality of transistor layers of an FET within the cavity of the template structure from the seed surface, wherein the RTD and FET are co-integrated along the substrate.

An advantage of the aforementioned device, system and/or method can be provision of power efficiency benefits. For example, such semiconductor device can employ less power than a conventional arbitrary waveform generator (AWG) to generate a control pulse for a qubit, such as employing about $10^4$ or even about $10^5$ lower power than a conventional AWG. Such semiconductor device can employ less power than a conventional Si CMOS solution to generate a control pulse for a qubit, such as employing about 5 times to about 10 times lower power than a conventional Si CMOS solution. Such benefits can be born from a tight co-integration on a chip level between the RTD and FET elements.

In addition, the RTD structure can be grown in a single step with the FET structure. That is, fabrication can be made more efficient where a single growth step can be employed for both the RTD structure and FET heterostructure.

In view of the one or more embodiments described herein, a practical application of the devices described herein can be ability to generate a signal to affect a qubit by employing low power. Such is a useful and practical application of computers, thus facilitating enhanced (e.g., improved and/or optimized) operation of the employed qubits, such as within a quantum logic circuit having high numbers of qubits, such as about 1000 qubits or more. These enhancements can be due to close co-integration of an RTD and FET in a semiconductor device generating such signal. Overall, such computerized tools can constitute a concrete and tangible technical improvement in the field of quantum computing.

Furthermore, one or more embodiments described herein can be employed in a real-world system based on the disclosed teachings. For example, one or more embodiments described herein can function within a quantum system that can receive as input a quantum job request and can measure a real-world qubit state of one or more qubits, such as superconducting qubits, of the quantum system. For example, a semiconductor device described herein can generate a signal or waveform to facilitate the readout from and/or relative to a quantum processor, and thus from the one or more qubits.

Moreover, a device and/or method described herein can be implemented in one or more domains, such as quantum domains, to enable scaled quantum program executions. Indeed, use of a device as described herein can be scalable, such as where a semiconductor device described herein can be employed in quantity to control and/or affect the same quantity or greater of qubits of a multi-qubit system. Thus, increased scaling of qubits provided in a cryogenic chamber can be enabled with less concern for available power input and power dissipation.

The systems and/or devices have been (and/or will be further) described herein with respect to interaction between one or more components. Such systems and/or components can include those components or sub-components specified therein, one or more of the specified components and/or sub-components, and/or additional components. Sub-components can be implemented as components communicatively coupled to other components rather than included within parent components. One or more components and/or sub-components can be combined into a single component providing aggregate functionality. The components can interact with one or more other components not specifically described herein for the sake of brevity, but known by those of skill in the art.

One or more embodiments described herein can be, in one or more embodiments, inherently and/or inextricably tied to computer technology and cannot be implemented outside of a computing environment. For example, one or more processes performed by one or more embodiments described herein can more efficiently, and even more feasibly, provide program and/or program instruction execution, such as relative to generation of a waveform, as compared to existing systems and/or techniques. Systems, computer-implemented methods and/or computer program products facilitating performance of these processes are of great utility in the field of quantum computing and superconducting quantum systems and cannot be equally practicably implemented in a sensible way outside of a computing environment.

One or more embodiments described herein can employ hardware and/or software to solve problems that are highly technical, that are not abstract, and that cannot be performed as a set of mental acts by a human. For example, a human, or even thousands of humans, cannot efficiently, accurately and/or effectively fabricate a semiconductor or generate a signal pulse as the one or more embodiments described herein can facilitate this process. And, neither can the human mind nor a human with pen and paper fabricate a semiconductor or generate a signal pulse, as conducted by one or more embodiments described herein.

In one or more embodiments, one or more of the processes described herein can be performed by one or more specialized computers (e.g., a specialized processing unit, a specialized classical computer, a specialized quantum computer, a specialized hybrid classical/quantum system and/or another type of specialized computer) to execute defined tasks related to the one or more technologies describe above. One or more embodiments described herein and/or components thereof can be employed to solve new problems that arise through advancements in technologies mentioned above, employment of quantum computing systems, cloud computing systems, computer architecture and/or another technology.

One or more embodiments described herein can be fully operational towards performing one or more other functions (e.g., fully powered on, fully executed and/or another function) while also performing the one or more operations described herein.

Figure 9:
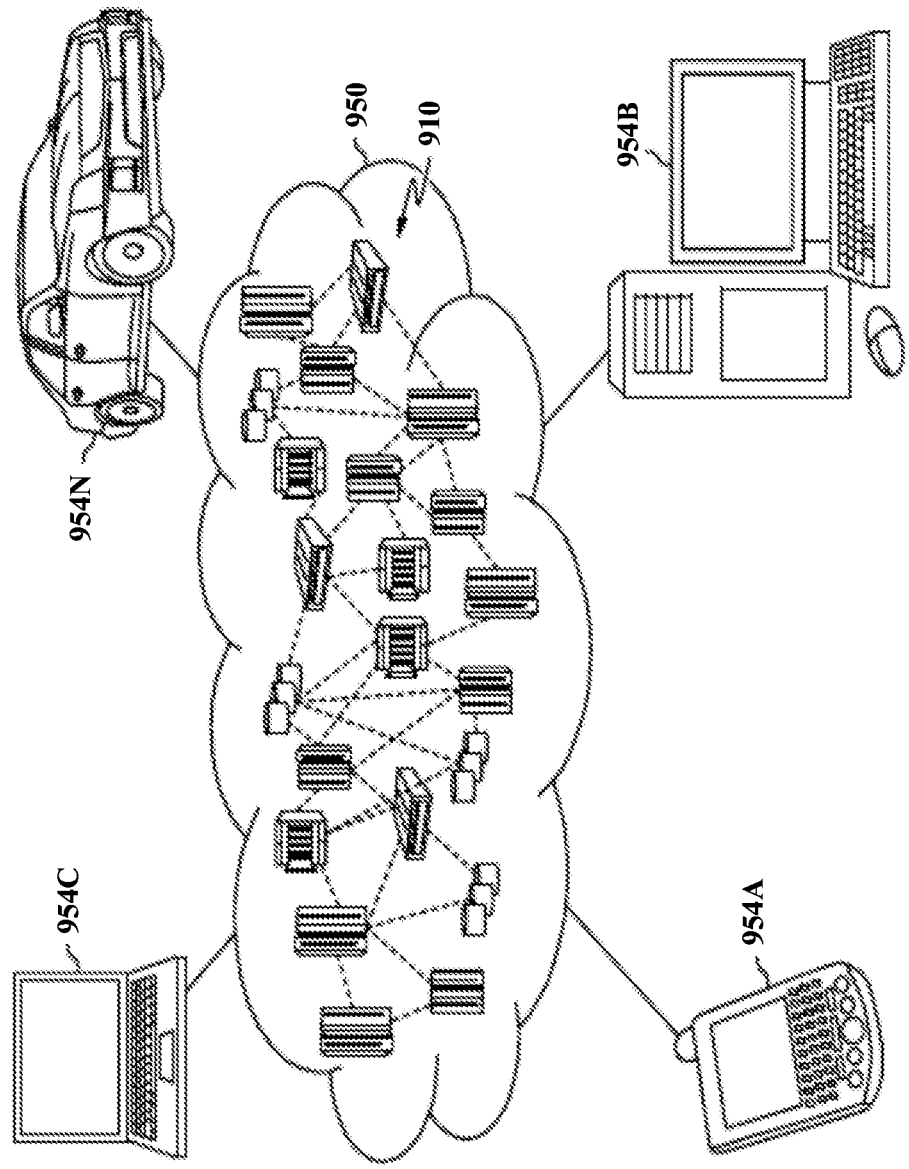
FIG. 9 illustrates a block diagram of an example, non-limiting, cloud computing environment in accordance with one or more embodiments described herein.
Figure 10:
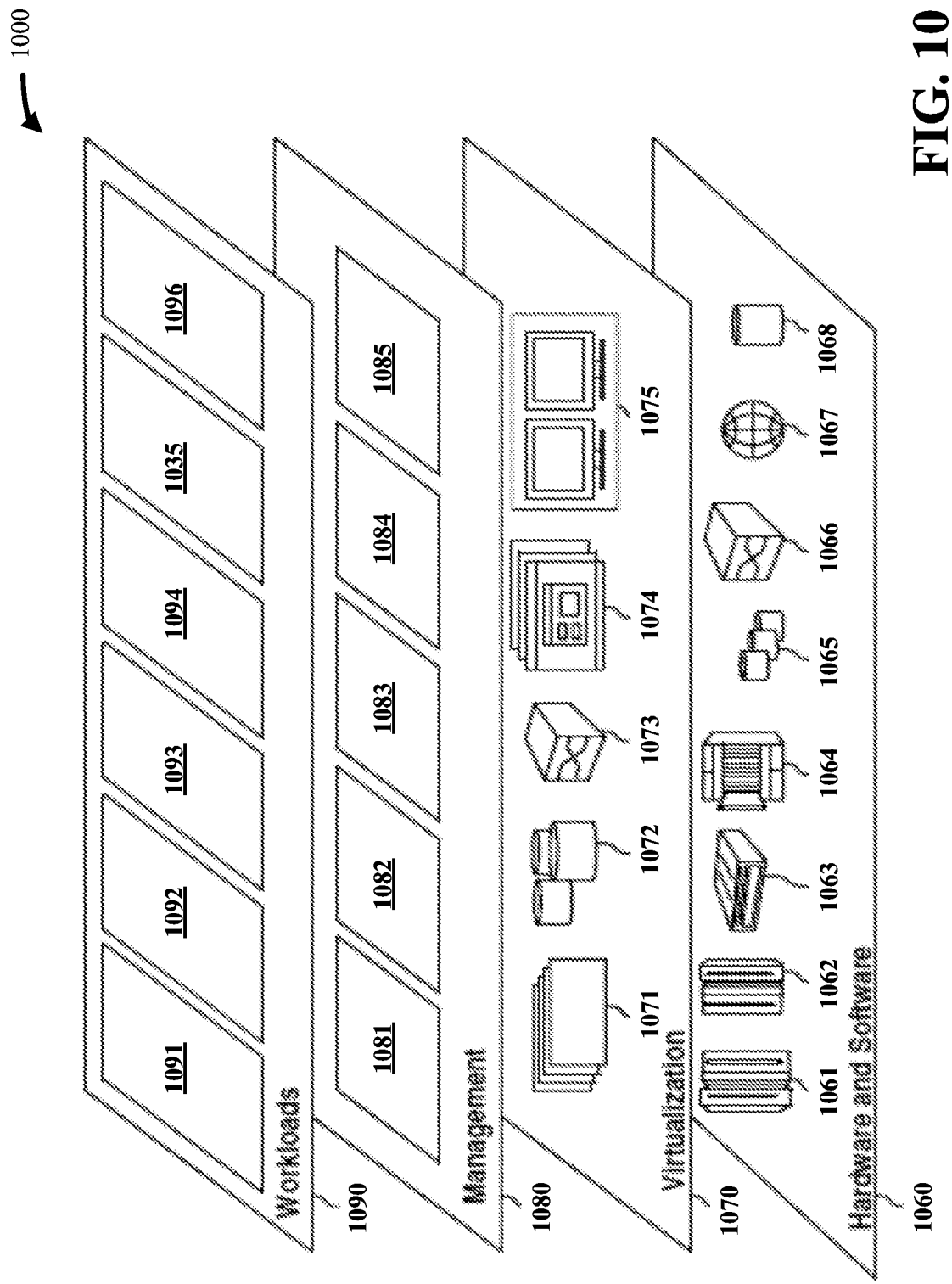
FIG. 10 illustrates a block diagram of example, non-limiting, abstraction model layers in accordance with one or more embodiments described herein.

Turning next to FIGS. 8-10, a detailed description is provided of additional context for the one or more embodiments described herein at FIGS. 1-7.

FIG. 8 and the following discussion are intended to provide a brief, general description of a suitable operating environment 800 which can be comprised by, be associated with and/or be coupled to one or more computer and/or computing-based elements described herein with reference to FIG. 1. For example, such suitable operating environment 800 can, in one or more embodiments, obtain and/or transmit a quantum job request (e.g., quantum job request 104) to the quantum system 101, manage a quantum job queue, and/or manage one or more classical operations in conjunction with the quantum system 101. Further, while one or more embodiments have been described above in the general context of computer-executable instructions that can run on one or more computers, those skilled in the art will recognize that one or more embodiments also can be implemented in combination with other program modules and/or as a combination of hardware and software.

Generally, program modules include routines, programs, components, data structures and/or the like, that perform particular tasks and/or implement particular abstract data types. Moreover, the inventive methods can be practiced with other computer system configurations, including single-processor or multiprocessor computer systems, minicomputers, mainframe computers, Internet of Things (IoT) devices, distributed computing systems, as well as personal computers, hand-held computing devices, microprocessor-based or programmable consumer electronics, and/or the like, each of which can be operatively coupled to one or more associated devices.

Computing devices typically include a variety of media, which can include computer-readable storage media, machine-readable storage media and/or communications media, which two terms are used herein differently from one another as follows. Computer-readable storage media or machine-readable storage media can be any available storage media that can be accessed by the computer and includes both volatile and nonvolatile media, removable and non-removable media. By way of example, but not limitation, computer-readable storage media and/or machine-readable storage media can be implemented in connection with any method or technology for storage of information such as computer-readable and/or machine-readable instructions, program modules, structured data and/or unstructured data.

Computer-readable storage media can include, but are not limited to, random access memory (RAM), read only memory (ROM), electrically erasable programmable read only memory (EEPROM), flash memory or other memory technology, compact disk read only memory (CD ROM), digital versatile disk (DVD), Blu-ray disc (BD) and/or other optical disk storage, magnetic cassettes, magnetic tape, magnetic disk storage and/or other magnetic storage devices, solid state drives or other solid state storage devices and/or other tangible and/or non-transitory media which can be used to store specified information. In this regard, the terms "tangible" or "non-transitory" herein as applied to storage, memory and/or computer-readable media, are to be understood to exclude only propagating transitory signals per se as modifiers and do not relinquish rights to all standard storage, memory and/or computer-readable media that are not only propagating transitory signals per se.

Computer-readable storage media can be accessed by one or more local or remote computing devices, e.g., via access requests, queries and/or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set and/or changed in such a manner as to encode information in one or more signals. By way of example, but not limitation, communication media can include wired media, such as a wired network, direct-wired connection and/or wireless media such as acoustic, RF, infrared and/or other wireless media.

With reference again to FIG. 8, the example operating environment 800 can comprise a computer 802, the computer 802 including a processing unit 806, a system memory 804 and/or a system bus 808.

Memory 804 can store one or more computer and/or machine readable, writable and/or executable components and/or instructions that, when executed by processing unit 806 (e.g., a classical processor, a quantum processor and/or like processor), can facilitate performance of operations defined by the executable component(s) and/or instruction (s). For example, memory 804 can store computer and/or machine readable, writable and/or executable components and/or instructions that, when executed by processing unit 806, can facilitate execution of the one or more functions described herein relating to non-limiting system 100, as described herein with or without reference to the one or more figures of the one or more embodiments.

Memory 804 can comprise volatile memory (e.g., random access memory (RAM), static RAM (SRAM), dynamic RAM (DRAM) and/or the like) and/or non-volatile memory (e.g., read only memory (ROM), programmable ROM (PROM), electrically programmable ROM (EPROM), electrically erasable programmable ROM (EEPROM) and/or the like) that can employ one or more memory architectures.

Processing unit 806 can comprise one or more types of processors and/or electronic circuitry (e.g., a classical processor, a quantum processor and/or like processor) that can implement one or more computer and/or machine readable, writable and/or executable components and/or instructions that can be stored at memory 804. For example, processing unit 806 can perform one or more operations that can be specified by computer and/or machine readable, writable and/or executable components and/or instructions including, but not limited to, logic, control, input/output (I/O), arithmetic and/or the like. In one or more embodiments, processing unit 806 can be any of one or more commercially available processors. In one or more embodiments, processing unit 806 can comprise one or more central processing unit, multi-core processor, microprocessor, dual microprocessors, microcontroller, System on a Chip (SOC), array processor, vector processor, quantum processor and/or another type of processor. The examples of processing unit 806 can be employed to implement one or more embodiments described herein.

The system bus 808 can couple system components including, but not limited to, the system memory 804 to the processing unit 806. The system bus 808 can comprise one or more types of bus structure that can further interconnect to a memory bus (with or without a memory controller), a peripheral bus and/or a local bus using one or more of a variety of commercially available bus architectures. The system memory 804 can include ROM 810 and/or RAM 812. A basic input/output system (BIOS) can be stored in a non-volatile memory such as ROM, erasable programmable read only memory (EPROM) and/or EEPROM, which BIOS contains the basic routines that help to transfer information among elements within the computer 802, such as during startup. The RAM 812 can include a high-speed RAM, such as static RAM for caching data.

The computer 802 can include an internal hard disk drive (HDD) 814 (e.g., EIDE, SATA), one or more external storage devices 816 (e.g., a magnetic floppy disk drive (FDD), a memory stick or flash drive reader, a memory card reader and/or the like) and/or a drive 820, e.g., such as a solid state drive or an optical disk drive, which can read or write from a disk 822, such as a CD-ROM disc, a DVD, a BD and/or the like. Additionally, and/or alternatively, where a solid-state drive is involved, disk 822 could not be included, unless separate. While the internal HDD 814 is illustrated as located within the computer 802, the internal HDD 814 can also be configured for external use in a suitable chassis (not shown). Additionally, while not shown in operating environment 800, a solid-state drive (SSD) can be used in addition to, or in place of, an HDD 814. The HDD 814, external storage device(s) 816 and drive 820 can be connected to the system bus 808 by an HDD interface 824, an external storage interface 826 and a drive interface 828, respectively. The HDD interface 824 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 802, the drives and storage media accommodate the storage of any data in a suitable digital format. Although the description of computer-readable storage media above refers to respective types of storage devices, other types of storage media which are readable by a computer, whether presently existing or developed in the future, can also be used in the example operating environment, and/or that any such storage media can contain computer-executable instructions for performing the methods described herein.

A number of program modules can be stored in the drives and RAM 812, including an operating system 830, one or more applications 832, other program modules 834 and/or program data 836. All or portions of the operating system, applications, modules and/or data can also be cached in the RAM 812. The systems and/or methods described herein can be implemented utilizing one or more commercially available operating systems and/or combinations of operating systems.

Computer 802 can optionally comprise emulation technologies. For example, a hypervisor (not shown) or other intermediary can emulate a hardware environment for operating system 830, and the emulated hardware can optionally be different from the hardware illustrated in FIG. 8. In a related embodiment, operating system 830 can comprise one virtual machine (VM) of multiple VMs hosted at computer 802. Furthermore, operating system 830 can provide runtime environments, such as the JAVA runtime environment or the .NET framework, for applications 832. Runtime environments are consistent execution environments that can allow applications 832 to run on any operating system that includes the runtime environment. Similarly, operating system 830 can support containers, and applications 832 can be in the form of containers, which are lightweight, standalone, executable packages of software that include, e.g., code, runtime, system tools, system libraries and/or settings for an application.

Further, computer 802 can be enabled with a security module, such as a trusted processing module (TPM). For instance, with a TPM, boot components hash next in time boot components and wait for a match of results to secured values before loading a next boot component. This process can take place at any layer in the code execution stack of computer 802, e.g., applied at application execution level and/or at operating system (OS) kernel level, thereby enabling security at any level of code execution.

An entity can enter and/or transmit commands and/or information into the computer 802 through one or more wired/wireless input devices, e.g., a keyboard 838, a touch screen 840 and/or a pointing device, such as a mouse 842. Other input devices (not shown) can include a microphone, an infrared (IR) remote control, a radio frequency (RF) remote control and/or other remote control, a joystick, a virtual reality controller and/or virtual reality headset, a game pad, a stylus pen, an image input device, e.g., camera (s), a gesture sensor input device, a vision movement sensor input device, an emotion or facial detection device, a biometric input device, e.g., fingerprint and/or iris scanner, and/or the like. These and other input devices can be connected to the processing unit 806 through an input device interface 844 that can be coupled to the system bus 808, but can be connected by other interfaces, such as a parallel port, an IEEE 1394 serial port, a game port, a USB port, an IR interface, a BLUETOOTH® interface and/or the like.

A monitor 846 or other type of display device can be alternatively and/or additionally connected to the system bus 808 via an interface, such as a video adapter 848. In addition to the monitor 846, a computer typically includes other peripheral output devices (not shown), such as speakers, printers and/or the like.

The computer 802 can operate in a networked environment using logical connections via wired and/or wireless communications to one or more remote computers, such as a remote computer(s) 850. The remote computer(s) 850 can be a workstation, a server computer, a router, a personal computer, portable computer, microprocessor-based entertainment appliance, a peer device and/or other common network node, and typically includes many or all of the elements described relative to the computer 802, although, for purposes of brevity, only a memory/storage device 852 is illustrated. Additionally, and/or alternatively, the computer 802 can be coupled (e.g., communicatively, electrically, operatively, optically and/or the like) to one or more external systems, sources and/or devices (e.g., classical and/or quantum computing devices, communication devices and/or like device) via a data cable (e.g., High-Definition Multimedia Interface (HDMI), recommended standard (RS) 232, Ethernet cable and/or the like).

In one or more embodiments, a network can comprise one or more wired and/or wireless networks, including, but not limited to, a cellular network, a wide area network (WAN) (e.g., the Internet), or a local area network (LAN). For example, one or more embodiments described herein can communicate with one or more external systems, sources and/or devices, for instance, computing devices (and vice versa) using virtually any specified wired or wireless technology, including but not limited to: wireless fidelity (Wi-Fi), global system for mobile communications (GSM), universal mobile telecommunications system (UMTS), worldwide interoperability for microwave access (WiMAX), enhanced general packet radio service (enhanced GPRS), third generation partnership project (3GPP) long term evolution (LTE), third generation partnership project 2 (3GPP2) ultra-mobile broadband (UMB), high speed packet access (HSPA), Zigbee and other 802.XX wireless technologies and/or legacy telecommunication technologies, BLUETOOTH®, Session Initiation Protocol (SIP), ZIGBEE®, RF4CE protocol, WirelessHART protocol, 6LoWPAN (IPv6 over Low power Wireless Area Networks), Z-Wave, an ANT, an ultra-wideband (UWB) standard protocol and/or other proprietary and/or non-proprietary communication protocols. In a related example, one or more embodiments described herein can include hardware (e.g., a central processing unit (CPU), a transceiver, a decoder, quantum hardware, a quantum processor and/or the like), software (e.g., a set of threads, a set of processes, software in execution, quantum pulse schedule, quantum circuit, quantum gates and/or the like) and/or a combination of hardware and/or software that facilitates communicating information among one or more embodiments described herein and external systems, sources and/or devices (e.g., computing devices, communication devices and/or the like).

The logical connections depicted include wired/wireless connectivity to a local area network (LAN) 854 and/or larger networks, e.g., a wide area network (WAN) 856. LAN and WAN networking environments can be commonplace in offices and companies and can facilitate enterprise-wide computer networks, such as intranets, all of which can connect to a global communications network, e.g., the Internet.

When used in a LAN networking environment, the computer 802 can be connected to the local network 854 through a wired and/or wireless communication network interface or adapter 858. The adapter 858 can facilitate wired and/or wireless communication to the LAN 854, which can also include a wireless access point (AP) disposed thereon for communicating with the adapter 858 in a wireless mode.

When used in a WAN networking environment, the computer 802 can include a modem 860 and/or can be connected to a communications server on the WAN 856 via other means for establishing communications over the WAN 856, such as by way of the Internet. The modem 860, which can be internal and/or external and a wired and/or wireless device, can be connected to the system bus 808 via the input device interface 844. In a networked environment, program modules depicted relative to the computer 802 or portions thereof can be stored in the remote memory/storage device 852. The network connections shown are merely exemplary and one or more other means of establishing a communications link among the computers can be used.

When used in either a LAN or WAN networking environment, the computer 802 can access cloud storage systems or other network-based storage systems in addition to, and/or in place of, external storage devices 816 as described above, such as but not limited to, a network virtual machine providing one or more aspects of storage and/or processing of information. Generally, a connection between the computer 802 and a cloud storage system can be established over a LAN 854 or WAN 856 e.g., by the adapter 858 or modem 860, respectively. Upon connecting the computer 802 to an associated cloud storage system, the external storage interface 826 can, such as with the aid of the adapter 858 and/or modem 860, manage storage provided by the cloud storage system as it would other types of external storage. For instance, the external storage interface 826 can be configured to provide access to cloud storage sources as if those sources were physically connected to the computer 802.

The computer 802 can be operable to communicate with any wireless devices and/or entities operatively disposed in wireless communication, e.g., a printer, scanner, desktop and/or portable computer, portable data assistant, communications satellite, telephone and/or any piece of equipment or location associated with a wirelessly detectable tag (e.g., a kiosk, news stand, store shelf and/or the like). This can include Wireless Fidelity (Wi-Fi) and BLUETOOTH® wireless technologies. Thus, the communication can be a predefined structure as with a conventional network or simply an ad hoc communication between at least two devices.

The illustrated embodiments described herein can be employed relative to distributed computing environments (e.g., cloud computing environments), such as described below with respect to FIG. 9, where certain tasks are performed by remote processing devices that are linked through a communications network. In a distributed computing environment, program modules can be located both in local and/or remote memory storage devices.

For example, one or more embodiments described herein and/or one or more components thereof can employ one or more computing resources of the cloud computing environment 950 described below with reference to the illustration 900 of FIG. 9, and/or with reference to the one or more functional abstraction layers (e.g., quantum software and/or the like) described below with reference to FIG. 10, to execute one or more operations in accordance with one or more embodiments described herein. For example, cloud computing environment 950 and/or one or more of the functional abstraction layers 1060, 1070, 1080 and/or 1090 can comprise one or more classical computing devices (e.g., classical computer, classical processor, virtual machine, server and/or the like), quantum hardware and/or quantum software (e.g., quantum computing device, quantum computer, quantum processor, quantum circuit simulation software, superconducting circuit and/or the like) that can be employed by one or more embodiments described herein and/or components thereof to execute one or more operations in accordance with one or more embodiments described herein. For instance, one or more embodiments described herein and/or components thereof can employ such one or more classical and/or quantum computing resources to execute one or more classical and/or quantum: mathematical function, calculation and/or equation; computing and/or processing script; algorithm; model (e.g., artificial intelligence (AI) model, machine learning (ML) model and/or like model); and/or other operation in accordance with one or more embodiments described herein.

It is to be understood that although one or more embodiments described herein include a detailed description on cloud computing, implementation of the teachings recited herein are not limited to a cloud computing environment. Rather, one or more embodiments described herein are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines and/or services) that can be rapidly provisioned and released with minimal management effort or interaction with a provider of the service. This cloud model can include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but can specify location at a higher level of abstraction (e.g., country, state and/or datacenter).

Rapid elasticity: capabilities can be rapidly and elastically provisioned, in one or more cases automatically, to quickly scale out and rapidly released to quickly scale in. To the consumer, the capabilities available for provisioning can appear to be unlimited and can be purchased in any quantity at any time.

Measured service: cloud systems automatically control and optimize resource use by leveraging a metering capability at one or more levels of abstraction appropriate to the type of service (e.g., storage, processing, bandwidth and/or active user accounts). Resource usage can be monitored, controlled and/or reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage and/or individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems and/or storage, but has control over the deployed applications and possibly application hosting environment configurations.

Infrastructure as a Service (IaaS): the capability provided to the consumer is to provision processing, storage, networks and/or other fundamental computing resources where the consumer can deploy and run arbitrary software, which can include operating systems and applications. The consumer does not manage or control the underlying cloud infrastructure but has control over operating systems, storage, deployed applications and/or possibly limited control of select networking components (e.g., host firewalls).

Deployment Models are as follows:

Private cloud: the cloud infrastructure is operated solely for an organization. It can be managed by the organization or a third party and can exist on-premises or off-premises.

Community cloud: the cloud infrastructure is shared by several organizations and supports a specific community that has shared concerns (e.g., mission, security requirements, policy and/or compliance considerations). It can be managed by the organizations or a third party and can exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community or public) that remain unique entities but are bound together by standardized or proprietary technology that enables data and application portability (e.g., cloud bursting for load-balancing among clouds).

A cloud computing environment is service oriented with a focus on statelessness, low coupling, modularity and/or semantic interoperability. At the heart of cloud computing is an infrastructure that includes a network of interconnected nodes.

Moreover, the non-limiting system 100 and/or the example operating environment 800 can be associated with and/or be included in a data analytics system, a data processing system, a graph analytics system, a graph processing system, a big data system, a social network system, a speech recognition system, an image recognition system, a graphical modeling system, a bioinformatics system, a data compression system, an artificial intelligence system, an authentication system, a syntactic pattern recognition system, a medical system, a health monitoring system, a network system, a computer network system, a communication system, a router system, a server system, a high availability server system (e.g., a Telecom server system), a Web server system, a file server system, a data server system, a disk array system, a powered insertion board system, a cloud-based system and/or the like. In accordance therewith, non-limiting system 100 and/or example operating environment 800 can be employed to use hardware and/or software to solve problems that are highly technical in nature, that are not abstract and/or that cannot be performed as a set of mental acts by a human.

Referring now to details of one or more aspects illustrated at FIG. 9, the illustrative cloud computing environment 950 is depicted. As shown, cloud computing environment 950 includes one or more cloud computing nodes 910 with which local computing devices used by cloud consumers, such as, for example, personal digital assistant (PDA) or cellular telephone 954A, desktop computer 954B, laptop computer 954C and/or automobile computer system 954N can communicate. Although not illustrated in FIG. 9, cloud computing nodes 910 can further comprise a quantum platform (e.g., quantum computer, quantum hardware, quantum software and/or the like) with which local computing devices used by cloud consumers can communicate. Cloud computing nodes 910 can communicate with one another. They can be grouped (not shown) physically or virtually, in one or more networks, such as Private, Community, Public, or Hybrid clouds as described hereinabove, or a combination thereof. This allows cloud computing environment 950 to offer infrastructure, platforms and/or software as services for which a cloud consumer does not need to maintain resources on a local computing device. It is understood that the types of computing devices 954A-N shown in FIG. 9 are intended to be illustrative only and that cloud computing nodes 910 and cloud computing environment 950 can communicate with any type of computerized device over any type of network and/or network addressable connection (e.g., using a web browser).

Referring now to details of one or more aspects illustrated at FIG. 10, a set 1000 of functional abstraction layers is shown, such as provided by cloud computing environment 950 (FIG. 9). One or more embodiments described herein can be associated with, such as accessible via, one or more functional abstraction layers described below with reference to FIG. 10 (e.g., hardware and software layer 1060, virtualization layer 1070, management layer 1080 and/or workloads layer 1090). It should be understood in advance that the components, layers and/or functions shown in FIG. 10 are intended to be illustrative only and embodiments described herein are not limited thereto. As depicted, the following layers and/or corresponding functions are provided:

Hardware and software layer 1060 can include hardware and software components. Examples of hardware components include: mainframes 1061; RISC (Reduced Instruction Set Computer) architecture-based servers 1062; servers 1063; blade servers 1064; storage devices 1065; and/or networks and/or networking components 1066. In one or more embodiments, software components can include network application server software 1067, quantum platform routing software 1068; and/or quantum software (not illustrated in FIG. 10).

Virtualization layer 1070 can provide an abstraction layer from which the following examples of virtual entities can be provided: virtual servers 1071; virtual storage 1072; virtual networks 1073, including virtual private networks; virtual applications and/or operating systems 1074; and/or virtual clients 1075.

In one example, management layer 1080 can provide the functions described below. Resource provisioning 1081 can provide dynamic procurement of computing resources and other resources that can be utilized to perform tasks within the cloud computing environment. Metering and Pricing 1082 can provide cost tracking as resources are utilized within the cloud computing environment, and/or billing and/or invoicing for consumption of these resources. In one example, these resources can include one or more application software licenses. Security can provide identity verification for cloud consumers and/or tasks, as well as protection for data and/or other resources. User (or entity) portal 1083 can provide access to the cloud computing environment for consumers and system administrators. Service level management 1084 can provide cloud computing resource allocation and/or management such that required service levels are met. Service Level Agreement (SLA) planning and fulfillment 1085 can provide pre-arrangement for, and procurement of, cloud computing resources for which a future requirement is anticipated in accordance with an SLA.

Workloads layer 1090 can provide examples of functionality for which the cloud computing environment can be utilized. Non-limiting examples of workloads and functions which can be provided from this layer include: mapping and navigation 1091; software development and lifecycle management 1092; virtual classroom education delivery 1093; data analytics processing 1094; transaction processing 1095; and/or application transformation software 1096.

The embodiments described herein can be directed to one or more of a system, a method, an apparatus and/or a computer program product at any possible technical detail level of integration. The computer program product can include a computer readable storage medium (or media) having computer readable program instructions thereon for causing a processor to carry out aspects of the one or more embodiments described herein. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a superconducting storage device and/or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon and/or any suitable combination of the foregoing. A computer readable storage medium, as used herein, is not to be construed as being transitory signals per se, such as radio waves and/or other freely propagating electromagnetic waves, electromagnetic waves propagating through a waveguide and/or other transmission media (e.g., light pulses passing through a fiber-optic cable), and/or electrical signals transmitted through a wire.

Computer readable program instructions described herein can be downloaded to respective computing/processing devices from a computer readable storage medium and/or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of the one or more embodiments described herein can be assembler instructions, instruction-set-architecture (ISA) instructions, machine instructions, machine dependent instructions, microcode, firmware instructions, state-setting data, configuration data for integrated circuitry, and/or source code and/or object code written in any combination of one or more programming languages, including an object oriented programming language such as Smalltalk, C++ or the like, and/or procedural programming languages, such as the "C" programming language and/or similar programming languages. The computer readable program instructions can execute entirely on a computer, partly on a computer, as a stand-alone software package, partly on a computer and/or partly on a remote computer or entirely on the remote computer and/or server. In the latter scenario, the remote computer can be connected to a computer through any type of network, including a local area network (LAN) and/or a wide area network (WAN), and/or the connection can be made to an external computer (for example, through the Internet using an Internet Service Provider). In one or more embodiments, electronic circuitry including, for example, programmable logic circuitry, field-programmable gate arrays (FPGA) and/or programmable logic arrays (PLA) can execute the computer readable program instructions by utilizing state information of the computer readable program instructions to personalize the electronic circuitry, in order to perform aspects of the one or more embodiments described herein.

Aspects of the one or more embodiments described herein are described with reference to flowchart illustrations and/or block diagrams of methods, apparatus (systems), and computer program products according to one or more embodiments described herein. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer and/or other programmable data processing apparatus to produce a machine, such that the instructions, which execute via the processor of the computer or other programmable data processing apparatus, can create means for implementing the functions/acts specified in the flowchart and/or block diagram block or blocks. These computer readable program instructions can also be stored in a computer readable storage medium that can direct a computer, a programmable data processing apparatus and/or other devices to function in a particular manner, such that the computer readable storage medium having instructions stored therein can comprise an article of manufacture including instructions which can implement aspects of the function/act specified in the flowchart and/or block diagram block or blocks. The computer readable program instructions can also be loaded onto a computer, other programmable data processing apparatus and/or other device to cause a series of operational acts to be performed on the computer, other programmable apparatus and/or other device to produce a computer implemented process, such that the instructions which execute on the computer, other programmable apparatus and/or other device implement the functions/acts specified in the flowchart and/or block diagram block or blocks.

The flowcharts and block diagrams in the figures illustrate the architecture, functionality and/or operation of possible implementations of systems, computer-implementable methods and/or computer program products according to one or more embodiments described herein. In this regard, each block in the flowchart or block diagrams can represent a module, segment and/or portion of instructions, which comprises one or more executable instructions for implementing the specified logical function(s). In one or more alternative implementations, the functions noted in the blocks can occur out of the order noted in the Figures. For example, two blocks shown in succession can be executed substantially concurrently, and/or the blocks can sometimes be executed in the reverse order, depending upon the functionality involved. It will also be noted that each block of the block diagrams and/or flowchart illustration, and/or combinations of blocks in the block diagrams and/or flowchart illustration, can be implemented by special purpose hardware-based systems that can perform the specified functions and/or acts and/or carry out one or more combinations of special purpose hardware and/or computer instructions.

While the subject matter has been described above in the general context of computer-executable instructions of a computer program product that runs on a computer and/or computers, those skilled in the art will recognize that the one or more embodiments herein also can be implemented in combination with one or more other program modules. Generally, program modules include routines, programs, components, data structures and/or the like that perform particular tasks and/or implement particular abstract data types. Moreover, the inventive computer-implemented methods can be practiced with other computer system configurations, including single-processor and/or multiprocessor computer systems, mini-computing devices, mainframe computers, as well as computers, hand-held computing devices (e.g., PDA, phone), microprocessor-based or programmable consumer and/or industrial electronics and/or the like. The illustrated aspects can also be practiced in distributed computing environments in which tasks are performed by remote processing devices that are linked through a communications network. One or more, if not all aspects of the one or more embodiments described herein can be practiced on stand-alone computers. In a distributed computing environment, program modules can be located in local and/or remote memory storage devices.

As used in this application, the terms "component," "system," "platform," "interface," and/or the like, can refer to and/or can include a computer-related entity or an entity related to an operational machine with one or more specific functionalities. The entities described herein can be either hardware, a combination of hardware and software, software, or software in execution. For example, a component can be, but is not limited to being, a process running on a processor, a processor, an object, an executable, a thread of execution, a program and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system and/or across a network such as the Internet with other systems via the signal). As another example, a component can be an apparatus with specific functionality provided by mechanical parts operated by electric or electronic circuitry, which is operated by a software and/or firmware application executed by a processor. In such a case, the processor can be internal and/or external to the apparatus and can execute at least a part of the software and/or firmware application. As yet another example, a component can be an apparatus that provides specific functionality through electronic components without mechanical parts, where the electronic components can include a processor and/or other means to execute software and/or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter described herein is not limited by such examples. In addition, any aspect or design described herein as an "example" and/or "exemplary" is not necessarily to be construed as preferred or advantageous over other aspects or designs, nor is it meant to preclude equivalent exemplary structures and/or techniques known to those of ordinary skill in the art.

As it is employed in the subject specification, the term "processor" can refer to substantially any computing processing unit and/or device comprising, but not limited to, single-core processors; single-processors with software multithread execution capability; multi-core processors; multi-core processors with software multithread execution capability; multi-core processors with hardware multithread technology; parallel platforms; and/or parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, and/or any combination thereof designed to perform the functions described herein. Further, processors can exploit nano-scale architectures such as, but not limited to, molecular and quantum-dot based transistors, switches and/or gates, in order to optimize space usage and/or to enhance performance of related equipment. A processor can be implemented as a combination of computing processing units.

Herein, terms such as "store," "storage," "data store," data storage," "database," and substantially any other information storage component relevant to operation and functionality of a component are utilized to refer to "memory components," entities embodied in a "memory," or components comprising a memory. Memory and/or memory components described herein can be either volatile memory or nonvolatile memory or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory and/or nonvolatile random access memory (RAM) (e.g., ferroelectric RAM (FeRAM). Volatile memory can include RAM, which can act as external cache memory, for example. By way of illustration and not limitation, RAM can be available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM) and/or Rambus dynamic RAM (RDRAM). Additionally, the described memory components of systems and/or computer-implemented methods herein are intended to include, without being limited to including, these and/or any other suitable types of memory.

What has been described above includes mere examples of systems and computer-implemented methods. It is, of course, not possible to describe every conceivable combination of components and/or computer-implemented methods for purposes of describing the one or more embodiments, but one of ordinary skill in the art can recognize that many further combinations and/or permutations of the one or more embodiments are possible. Furthermore, to the extent that the terms "includes," "has," "possesses," and the like are used in the detailed description, claims, appendices and/or drawings such terms are intended to be inclusive in a manner similar to the term "comprising" as "comprising" is interpreted when employed as a transitional word in a claim.

The descriptions of the one or more embodiments have been presented for purposes of illustration but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application and/or technical improvement over technologies found in the marketplace, and/or to enable others of ordinary skill in the art to understand the embodiments described herein.

What is claimed is:

1. A semiconductor device comprising: a resonant tunneling diode and a field effect transistor co-integrated in a common layer extending along an insulating layer of a substrate, wherein the resonant tunneling diode is directly adjacent to the field effect transistor, wherein the resonant tunneling diode comprises a first group of layers arranged in a first order, wherein each layer of the first group of layers is directly adjacent to and extends in a normal direction from a surface of the insulating layer of the substrate, wherein the field effect transistor comprises a second group of layers arranged in a second order, wherein each layer of the second group of layers is directly adjacent to and extends in the normal direction from the surface of the insulating layer of the substrate, wherein the first order of the first group of layers comprises in sequential order a collector layer, a first quantum well layer, a second quantum well layer, and an emitter layer, wherein the second order of the second group of layers comprises in sequential order a source layer, a channel layer, and a drain layer, and wherein a layer at one end of the first order of the first group of layers of the resonant tunneling diode is directly adjacent to a layer at one end of the second order of the second group of layers of the field effect transistor.

2. The semiconductor device according to claim 1, wherein the first group of layers of the resonant tunneling diode and the second group of layers of the field effect transistor are arranged next to one another along the substrate.

3. The semiconductor device according to claim 1, wherein the semiconductor device is configured to generate a signal pulse as a qubit control pulse.

4. The semiconductor device according to claim 1, wherein the field effect transistor is a III-V field effect transistor comprising a periodic group III-V semiconductor material, and wherein the periodic group III-V semiconductor material comprises a periodic group III element and a periodic group V element.

5. The semiconductor device according to claim 1, wherein the resonant tunneling diode is a III-V resonant tunneling diode comprising a periodic group III-V semiconductor material, and wherein the periodic group III-V semiconductor material comprises a periodic group III element and a periodic group V element.

6. The semiconductor device according to claim 1, wherein the layer at the one end of the second order of the second group of layers is the drain layer of the field effect transistor and the layer at the one end of the first order of the first group of layers is the emitter layer or the collector layer of the resonant tunneling diode.

7. The semiconductor device according to claim 1, wherein the layer at the one end of the second order of the second group of layers is the source layer of the field effect transistor and the layer at the one end of the first order of the first group of layers is the emitter layer or the collector layer of the resonant tunneling diode.

8. The semiconductor device according to claim 1, wherein the field effect transistor is a metal oxide semiconductor field effect transistor.

9. The semiconductor device according to claim 1, comprised by a quantum computer further comprising a cryostat, wherein the semiconductor device according to claim 1 is arranged inside the cryostat.

* * * * *